(12) United States Patent  
Eldridge et al.

(10) Patent No.: US 7,592,821 B2  
(45) Date of Patent: Sep. 22, 2009

(54) APPARATUS AND METHOD FOR MANAGING THERMALLY INDUCED MOTION OF A PROBE CARD ASSEMBLY

(75) Inventors: Benjamin N. Eldridge, Danville, CA (US); Gary W. Grube, Pleasanton, CA (US); Eric D. Hobbs, Livermore, CA (US); Gaetan L. Mathieu, Vareness, CA (US); Makarand S. Shinde, Livermore, CA (US); Alexander H. Slocum, Bow, NH (US); A. Nicholas Sporck, Saratoga, CA (US); Thomas N. Watson, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/877,466

(22) Filed: Oct. 23, 2007

(65) Prior Publication Data

US 2008/0042668 A1  Feb. 21, 2008

Related U.S. Application Data

(63) Continuation of application No. 11/306,515, filed on Dec. 30, 2005, now Pat. No. 7,285,968.

(60) Provisional application No. 60/594,562, filed on Apr. 19, 2005.

(51) Int. Cl.  
    *G01R 31/02* (2006.01)

(52) U.S. Cl. .................. 324/754; 324/760; 324/761

(58) Field of Classification Search ......... 324/754–765, 324/158.1, 73.1; 438/14–18  
See application file for complete search history.

(56) References Cited

U.S. PATENT DOCUMENTS 3,963,985 A  6/1976 Geldermans  
5,124,639 A * 6/1992 Carlin et al. ................ 324/760  
5,422,574 A  6/1995 Kister (Continued)

FOREIGN PATENT DOCUMENTS

JP        05-264590        10/1993

OTHER PUBLICATIONS

Int'l Preliminary Report On Patentability, PCT application PCT/US2006/014554 (Mar. 26, 2009), 7 pages.

(Continued)

*Primary Examiner*—Vinh P Nguyen  
(74) *Attorney, Agent, or Firm*—N. Kenneth Burraston

(57) ABSTRACT

A probe card assembly can include a probe head assembly having probes for contacting an electronic device to be tested. The probe head assembly can be electrically connected to a wiring substrate and mechanically attached to a stiffener plate. The wiring substrate can provide electrical connections to a testing apparatus, and the stiffener plate can provide structure for attaching the probe card assembly to the testing apparatus. The stiffener plate can have a greater mechanical strength than the wiring substrate and can be less susceptible to thermally induced movement than the wiring substrate. The wiring substrate may be attached to the stiffener plate at a central location of the wiring substrate. Space may be provided at other locations where the wiring substrate is attached to the stiffener plate so that the wiring substrate can expand and contract with respect to the stiffener plate.

23 Claims, 19 Drawing Sheets

U.S. PATENT DOCUMENTS

| | | | |
|---|---|---|---|
| 5,974,662 A | 11/1999 | Eldridge et al. | |
| 6,043,671 A | 3/2000 | Mizuta | |
| 6,246,247 B1 | 6/2001 | Eldridge et al. | |
| 6,509,751 B1 | 1/2003 | Mathieu et al. | |
| 6,615,485 B2 | 9/2003 | Eldridge et al. | |
| 6,624,648 B2 | 9/2003 | Eldridge et al. | |
| 6,762,612 B2 * | 7/2004 | Yu et al. | 324/757 |
| 6,784,678 B2 | 8/2004 | Pietzchmann | |
| 6,853,205 B1 * | 2/2005 | Cheng et al. | 324/754 |
| 6,891,385 B2 | 5/2005 | Miller | |
| 6,894,523 B2 | 5/2005 | Neeb | |
| 6,972,578 B2 | 12/2005 | Martens et al. | |
| 7,002,363 B2 | 2/2006 | Mathieu | |
| 7,064,953 B2 | 6/2006 | Miller | |
| 7,071,714 B2 | 7/2006 | Eldridge et al. | |
| 7,119,564 B2 * | 10/2006 | Martens et al. | 324/754 |
| 7,285,968 B2 | 10/2007 | Eldridge et al. | |
| 7,312,618 B2 | 12/2007 | Eldridge et al. | |
| 7,433,188 B2 | 10/2008 | Miller | |
| 2001/0015652 A1 | 8/2001 | Eldridge et al. | |
| 2002/0053734 A1 | 5/2002 | Eldridge et al. | |
| 2003/0085721 A1 | 5/2003 | Eldridge et al. | |
| 2004/0266089 A1 | 12/2004 | Mathieu et al. | |
| 2005/0206397 A1 | 9/2005 | Miller | |
| 2006/0001440 A1 | 1/2006 | Martens et al. | |
| 2007/0139060 A1 | 6/2007 | Martens et al. | |
| 2008/0094088 A1 | 4/2008 | Eldridge et al. | |

OTHER PUBLICATIONS

U.S. Appl. No. 12/477,748, filed Jun. 3, 2009, Eldridge et al.
U.S. Appl. No. 09/527,931, filed Mar. 17, 2008, Mathieu et al.
U.S. Appl. No. 12/275,491, filed Nov. 21, 2008, Yasumura.

* cited by examiner

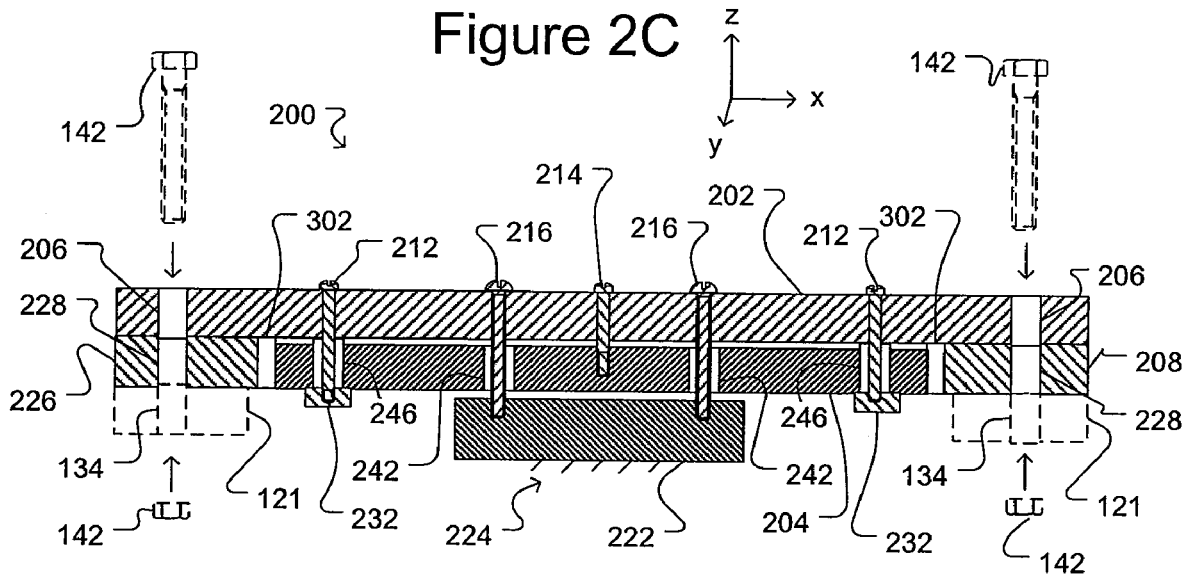
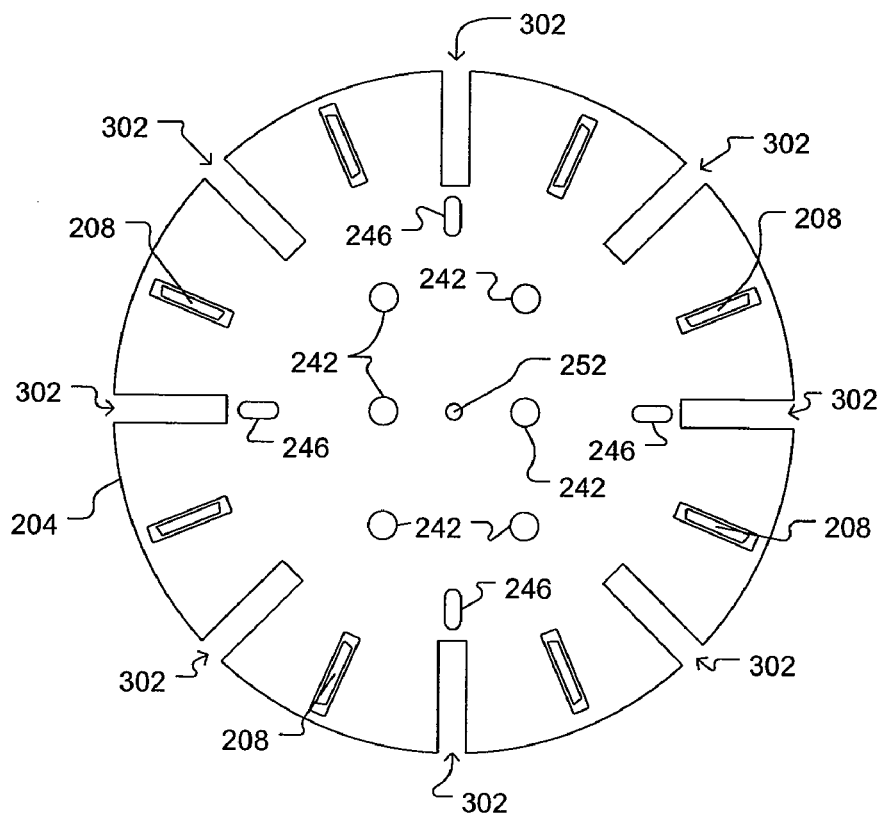

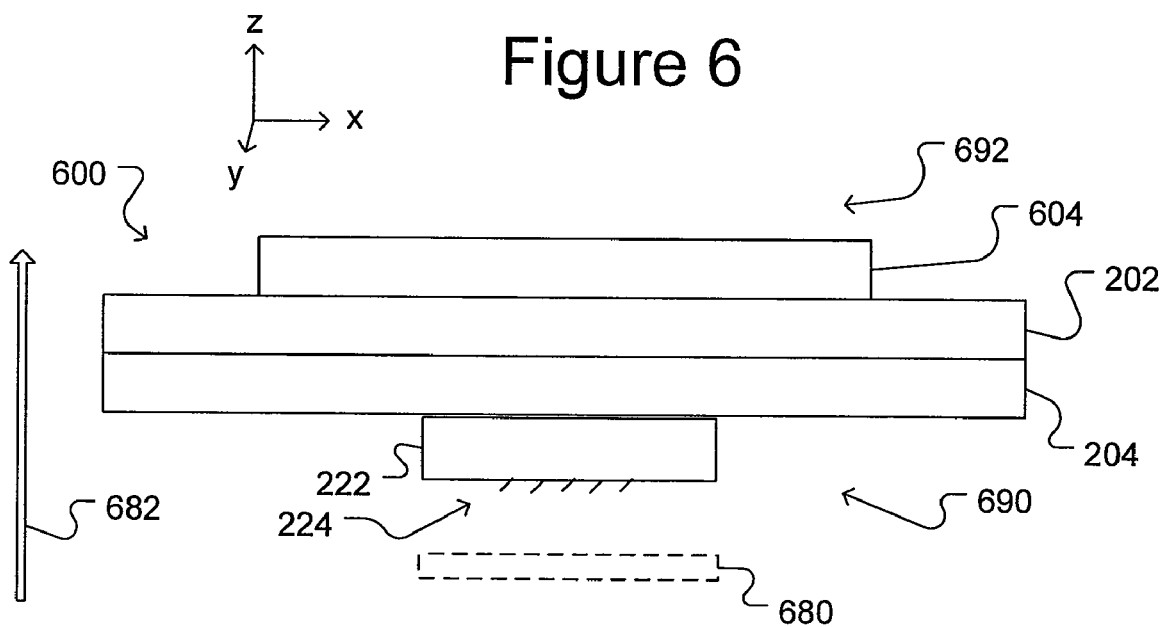

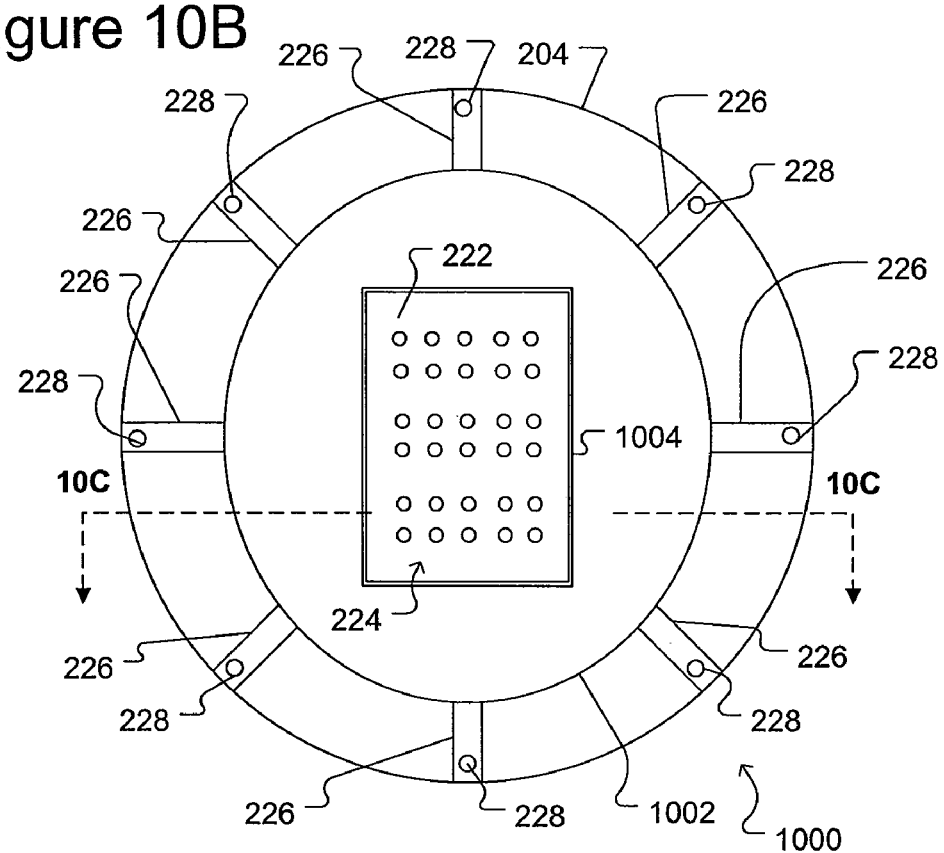
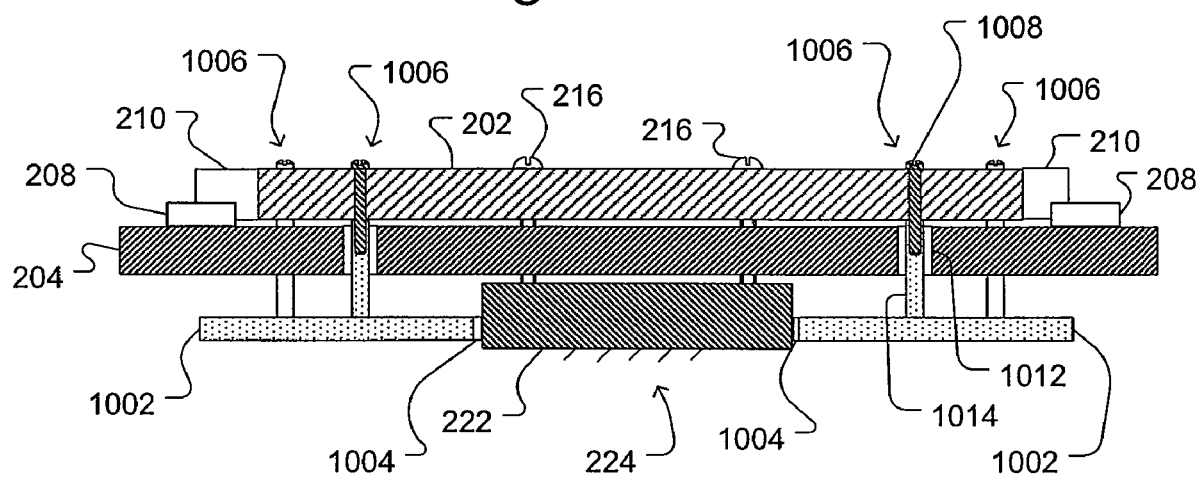

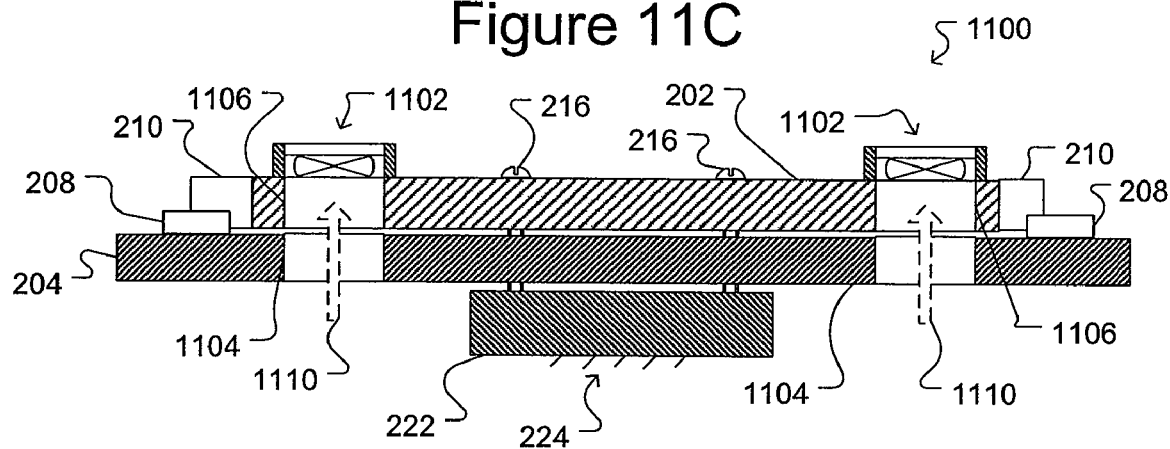
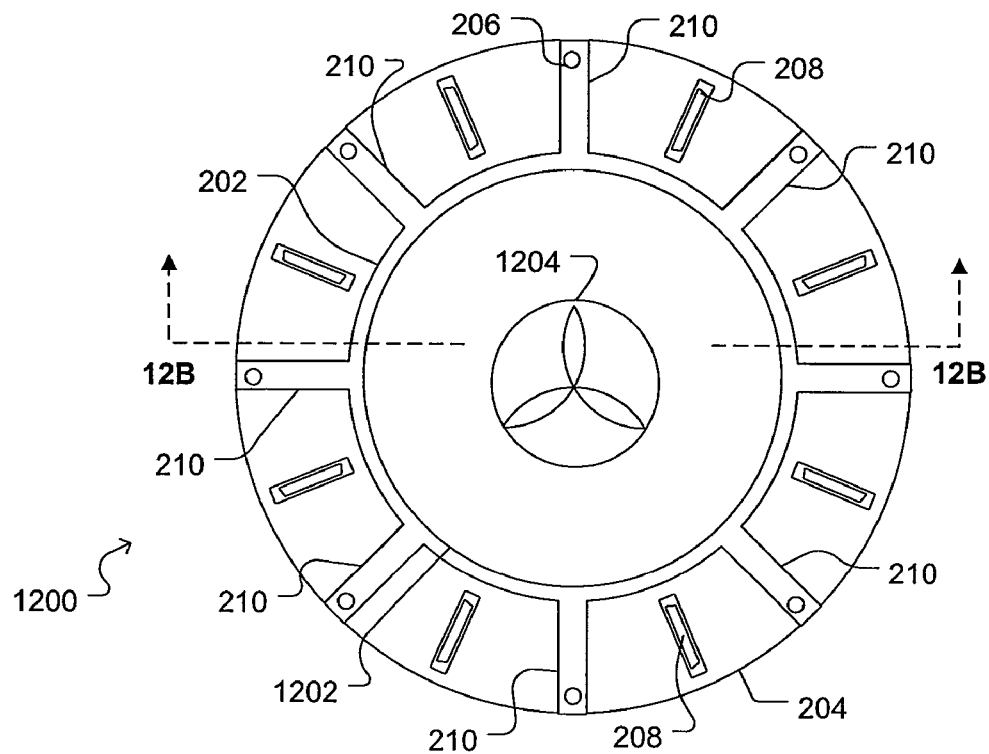

APPARATUS AND METHOD FOR MANAGING THERMALLY INDUCED MOTION OF A PROBE CARD ASSEMBLY

This Application is a Con. Of 11/306,515, filed on Dec. 30, 2005, now U.S. Pat No. 7,285,968, which claims benefit of 60/594,562, filed on Apr. 19, 2005.

BACKGROUND

FIG. 1A illustrates an exemplary prior art probing system used to test dies (not shown) on a newly manufactured semiconductor wafer 112 or other electronic devices. The probing system of FIG. 1A includes a test head 104 and a prober 102 (which is shown with a cut-away 126 to provide a partial view of the inside of the prober 102). To test the dies (not shown) of the semiconductor wafer 112, the wafer 112 is placed on a moveable stage 106 as shown in FIG. 1A, and the stage 106 is moved such that terminals (not shown) on dies (not shown) of the wafer 112 are brought into contact with probes 124 of a probe card assembly 108. Temporary electrical connections are thus established between the probes 124 and dies (not shown) of the wafer 112 to be tested.

Typically, a cable 110 or other communication means connects a tester (not shown) with the test head 104. Electrical connectors 114 electrically connect the test head 104 with the probe card assembly 108. The probe card assembly 108 shown in FIG. 1A includes a wiring board 120, which can provide electrical connections from connectors 114 to the probe substrate 122, and the probe substrate can provide electrical connections to the probes 124.

The cable 110, test head 104, and electrical connectors 114 thus provide electrical paths between the tester (not shown) and the probe card assembly 108, and the probe card assembly 108 extends those electrical paths to the probes 124. Thus, while the probes 124 are in contact with the terminals (not shown) of the dies (not shown) on the wafer 112, cable 110, test head 104, electrical connectors 114, and probe card assembly 108 provide a plurality of electrical paths between the tester (not shown) and the dies (not shown). The tester (not shown) writes test data through these electrical paths to the dies (not shown), and response data generated by the dies (not shown) in response to the test data is returned to the tester (not shown) through these electrical paths.

It is often advantageous to test the dies (not shown) of the wafer 112 at specific temperatures or over a range of temperatures. To this end, heating elements or cooling elements (not shown) may be included in the stage 106 or at other locations in the prober 102 to heat or cool the wafer 112 during testing. Even if heating elements or cooling elements (not shown) are not used, operation of the dies (not shown) of the wafer 112 may generate heat. Such heating or cooling from either heating/cooling elements (not shown) or from operation of the dies (not shown) may cause the wafer 112 and the probe substrate 122 to expand or contract, changing the positions of the probes 124 and the terminals (not shown) on the wafer 112, which may cause misalignment between the probes 124 and terminals (not shown) in a plane that is generally horizontal in FIG. 1A. (This horizontal plane is in the directions labeled "x, y" in FIG. 1A and will hereinafter be referred to as "x, y" movement. In FIG. 1A, the direction labeled "x" is horizontal across the page, the direction labeled "y" is horizontal into and out of the page, and the direction labeled "z" is vertical. These directions are relative and for convenience and are not to be taken as limiting.) If such "x, y" misalignment becomes too great, the probes 124 will no longer be able to contact all of the terminals (not shown).

The use of heating elements or cooling elements (not shown) to heat or cool the wafer 112 during testing, and/or the generation of heat by the dies of the wafer 112 as they are tested, may also cause a thermal gradient between the side of the probe card assembly 108 that faces the wafer 112 (hereinafter a side of the probe card assembly that faces the wafer 112 will be referred to as the "front-side" or the "wafer-side") and the opposite side of the probe card assembly (hereinafter the opposite side of the probe card assembly will be referred to as the "back-side" or the "tester side"). Such thermal gradients can cause the probe card assembly 108 to bow or warp. If such bowing is towards the wafer 112, the probe card assembly 108 may press against the wafer 112 with too much force and damage the wafer 112 or probe card assembly 108. If such bowing is away from the wafer 112, some or all of the probes 124 may move (in a generally vertical direction with respect to FIG. 1A) out of contact with the terminals (not shown) on the wafer 12. If the probes 124 do not contact the terminals (not shown), the dies (not shown) on the wafer 112 will falsely test as failed. (Movement to or away from the wafer 112 is labeled the "z" direction in FIG. 1A and will hereinafter be referred to as "z" movement.)

Often, immediately following installation of a probe card assembly 108 in a prober 102 with a heated (or cooled) stage 106, the probe card assembly 108 will undergo thermally induced movement. The movement stops and the position of the probe card assembly 108 stabilizes only after a sufficient temperature equilibrium is reached between the front-side and back-side of the probe card assembly 108. Of course, such an equilibrium need not be a perfect equilibrium in which the front-side temperature of the probe card assembly 108 exactly equals the back-side temperature; rather, the front-side temperature and the back-side temperature need only be sufficiently close that the structure of the probe card assembly 108 is able to resist thermal movement. The time required to reach such a temperature equilibrium or near equilibrium is often referred to as "thermal equilibrium time" or "thermal soak time."

Typically, the probe substrate 122 is attached directly to the wiring board 120, which in turn is attached to a test head plate 121 on the prober 102. A shown in FIG. 1B, the test head plate 121 forms an opening 132 in the prober 102 into which the probe substrate 122 fits (as generally shown in FIG. 1A). The test head plate 121 may include holes 134 for bolts that secure the probe card assembly 108 to the test head plate 121. (Clamping or techniques other than bolting may be used to attached the probe card assembly 108 to the test head plate 121.) The wiring board 120 is typically made of a printed circuit board material, which is particularly susceptible to thermally induced "x, y" and "z" movements. Improved techniques for counteracting thermally induced movements (including "x, y" movement and "z" movement) of a probe card assembly and reducing thermal equilibrium time would be desirable.

SUMMARY

According to some embodiments of a probe card assembly, a probe head assembly can be attached directly to a metallic stiffener plate, which can be configured to attach the probe card assembly to a prober. A wiring substrate can provide electrical connections to the probe head assembly. The wiring substrate can be attached to the stiffener plate such that the wiring substrate can expand and contract with respect to the stiffener plate. The stiffener plate can have a greater mechanical strength and/or stiffness than the wiring substrate and can thus be less susceptible to thermally induced movement and/ or deformation than the wiring substrate. The stiffener plate can also have a lower coefficient of thermal expansion than the wiring substrate.

According to some embodiments of a probe card assembly, a truss structure can be attached to the stiffener plate to further strengthen and/or stiffen the stiffener plate against thermally induced movement. Adjustment mechanisms may be included for adjusting an orientation and/or shape of the stiffener plate with respect to the truss structure.

According to some embodiments of a probe card assembly, a stud structure can be attached to the truss structure. While the probe card assembly is attached to a prober, a gripper on a test head can grip the stud structure, adding the strength of the test head to the truss structure to yet further strengthen the probe card assembly against thermally induced movement.

According to some embodiments of a probe card assembly, a heat sink can be provided for facilitating transfer of heat from the front-side of the probe card assembly to the back-side of the probe card assembly. Fans or heat pumps may be used in addition to or in place of the heat sink.

According to some embodiments of a probe card assembly, temperature control devices can be provided in a probe head assembly to heat and/or cool the probe head assembly during testing of an electronic device. By so doing, the probe head assembly can be expanded or contracted to match thermally induced expansion or contraction of the electronic device.

BRIEF DESCRIPTION OF THE DRAWINGS

FIG. 2C shows a side cross-sectional view of the probe card assembly of FIG. 2A.

FIG. 3A shows the wiring board of the probe card assembly of FIG. 2A according to some embodiments of the invention.

FIG. 6 is a simplified block diagram illustrating another exemplary probe card assembly according to some embodiments of the invention.

FIG. 10B illustrates a bottom view of the probe card assembly of FIG. 10A.

FIG. 10C illustrates a side cross-sectional view of the probe card assembly of FIG. 10A.

FIG. 11C illustrates a side cross-sectional view of the probe card assembly of FIG. 11A.

FIG. 12A shows a top view of yet a further exemplary probe card assembly according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 1A:
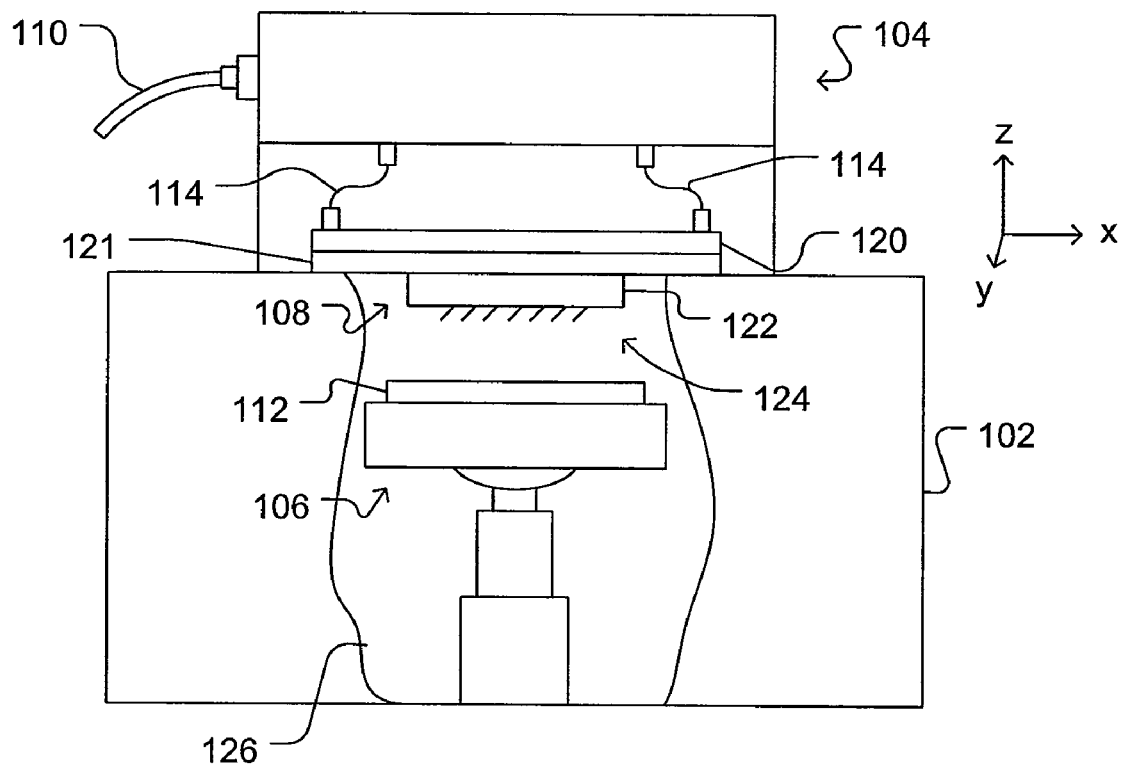
FIG. 1A shows a side view of an exemplary prior art prober, test head, and probe card assembly. A cut-out provides a partial view of the inside of the prober.
Figure 1B:
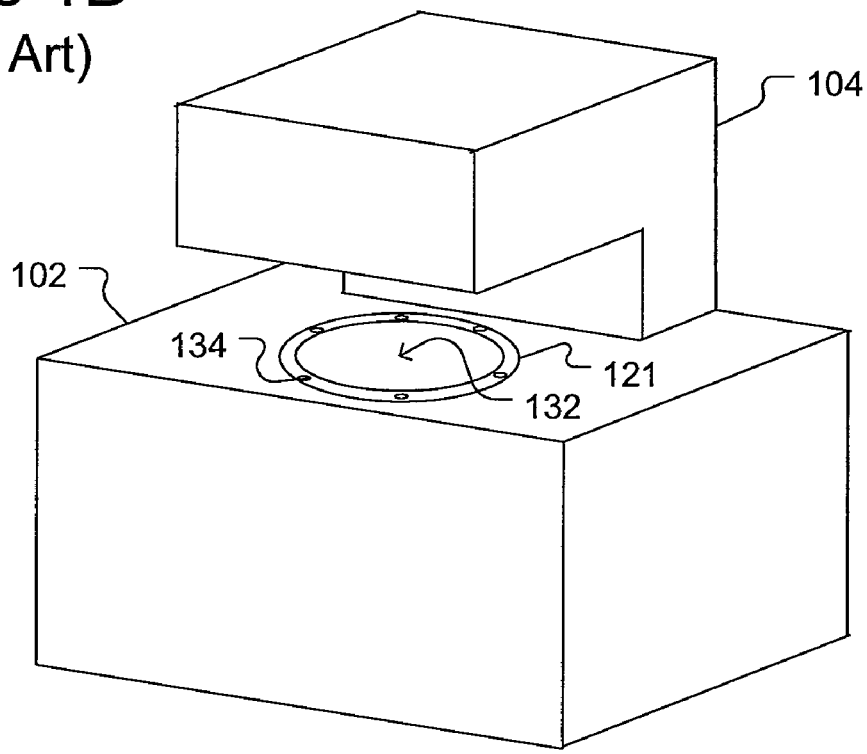
FIG. 1B shows a perspective view of the prober and test head of FIG. 1A without a probe card assembly.
Figure 2A:
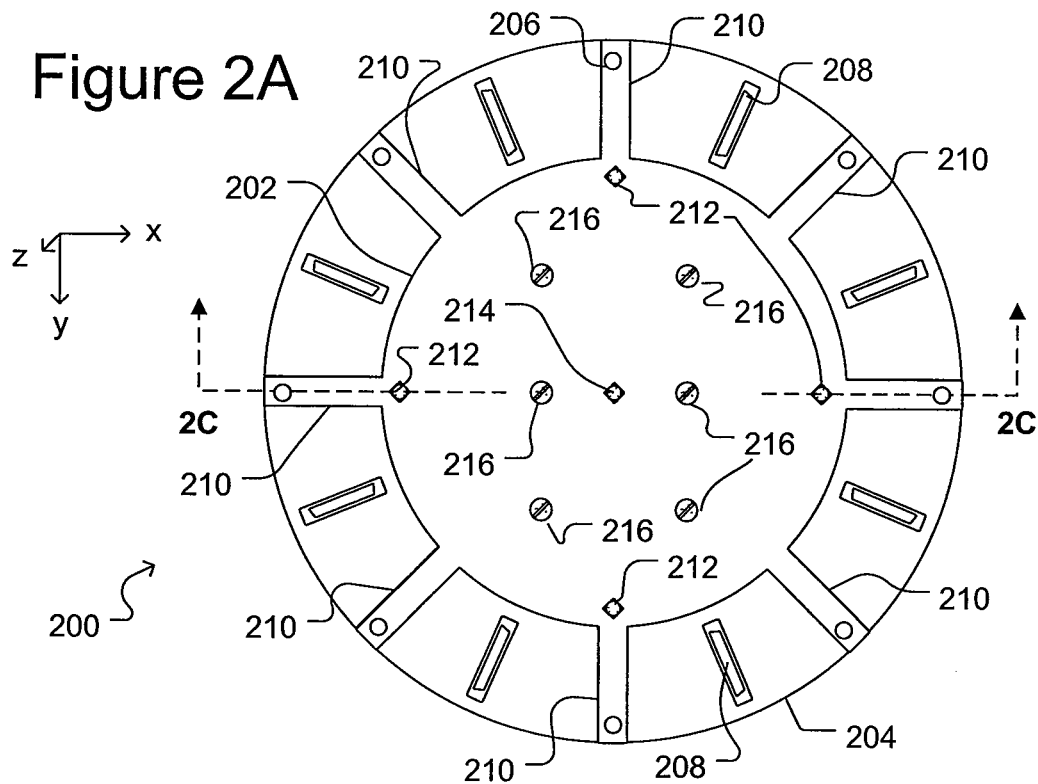
FIG. 2A shows a top view of an exemplary probe card assembly according to some embodiments of the invention.
Figure 2B:
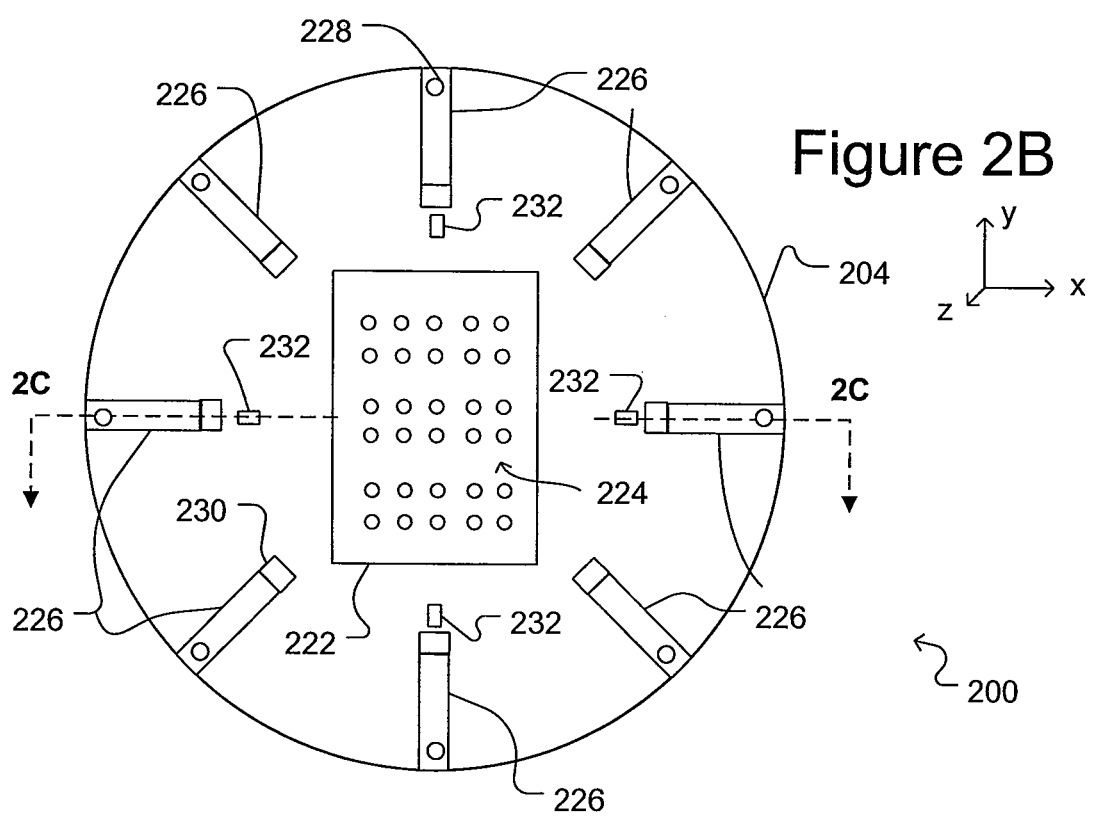
FIG. 2B shows a bottom view of the probe card assembly of FIG. 2A.
Figure 3B:
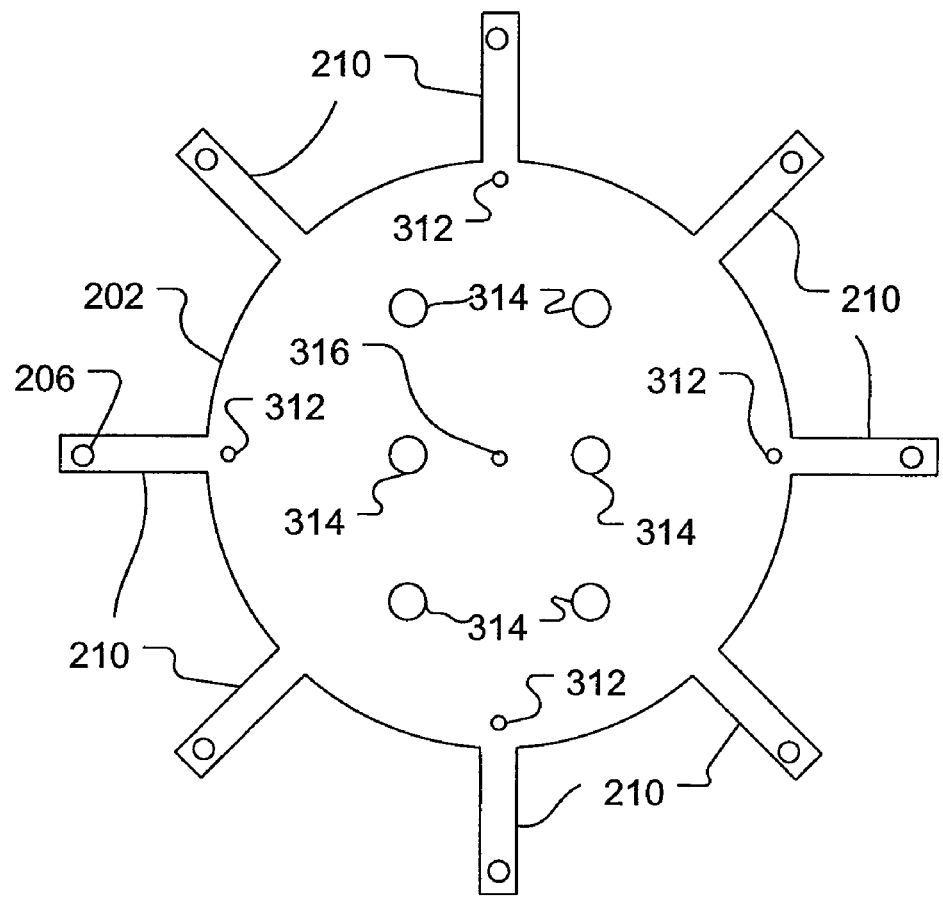
FIG. 3B shows the stiffener plate of the probe card assembly of FIG. 2A according to some embodiments of the invention.

FIGS. 2A, 2B, 2C, 3A, and 3B illustrate an exemplary probe card assembly 200 configured to resist "z" direction thermal movement according to some embodiments of the invention. (As used herein, movement includes movement, deformation, bending, warping, etc.) FIG. 2A is a top view, FIG. 2B is a bottom view, and FIG. 2C is a side cross-sectional view of the probe card assembly 200. (In FIGS. 2A and 2B, the "x" direction is horizontal across the page, the "y" direction is vertical on the page, and the "z" direction, although shown slightly askew, is perpendicular to—that is, into and out of—the page; in FIG. 2C, the "x" direction is horizontal across the page, the "y" direction, although shown slightly askew, is perpendicular—that is, into and out of—the page, and the "z" direction is vertical on the page. These directions are provided for purposes of illustration and discussion only, however, and are not limiting.) FIG. 3A illustrates a top view of just the wiring substrate 204, and FIG. 3B illustrates a top view of just the stiffener plate 202. Although not limited to use with the prober 102 and test head 104 of FIGS. 1A and 1B, the exemplary probe card assembly 200 shown in FIGS. 2A, 2B, and 2C may be used in the prober 102 and test head 104 of FIGS. 1A and 1B in place of probe card assembly 108.

As shown in FIGS. 2A, 2B, and 2C, the probe card assembly 200 can include a stiffener plate 202, a wiring substrate 204, and a probe head assembly 222. As shown in FIGS. 2B and 2C, the probe head assembly 222 can include a plurality of probes 224, which like probes 124 shown in FIG. 1A, can be configured to contact terminals (not shown) on semiconductor dies (not shown) to be tested. Probes 224 (or any of the probes discussed herein) can be resilient, conductive structures. Probes 224 may be a resilient, conductive structure. Non-limiting examples of suitable probes 224 include composite structures formed of a core wire bonded to a conductive terminal (not shown) on a probe head assembly (e.g., like probe head assembly 222) that is over coated with a resilient material as described in U.S. Pat. Nos. 5,476,211, 5,917,707, and 6,336,269. Probes 224 may alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119. Still other non-limiting examples of probes 224 are disclosed in U.S. Pat. Nos. 6,827,584, 6,640,432, U.S. pat. No. 6,441,315, and U.S. Patent Application Publication No. 2001/0012739. Other non-limiting examples of probes 224 include conductive pogo pins, bumps, studs, stamped springs, needles, buckling beams, etc.

The dies (not shown) to be tested can be dies of an unsingulated semiconductor wafer (e.g., like wafer 112 of FIG. 1A), singulated dies (e.g., held in a carrier (not shown)), dies forming a multi-chip module, or any other arrangement of dies to be tested. As will be seen, the wiring substrate 204 can provide electrical connections to the probe head assembly 222, and the stiffener plate 202 can provide mechanical stability to the probe head assembly 222.

Figure 4:
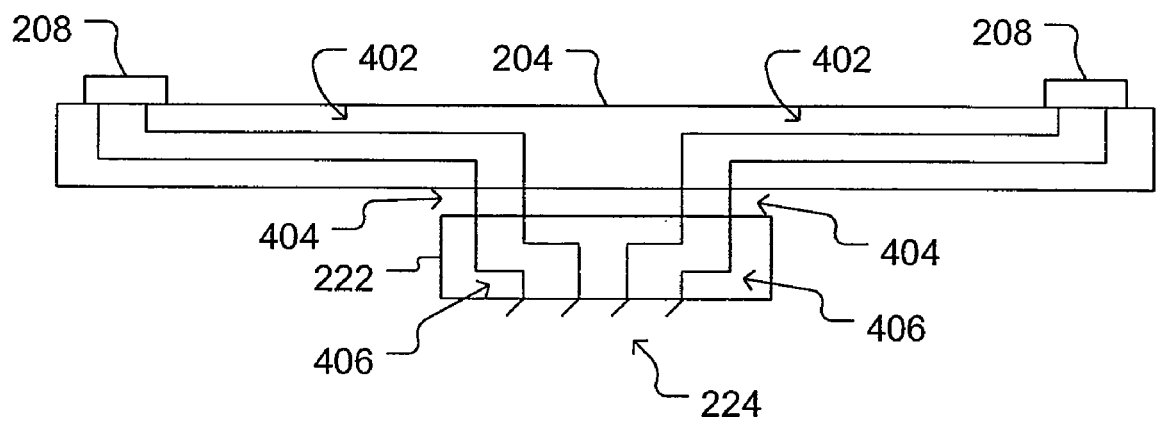
FIG. 4 is a schematic view of the wiring substrate and probe head assembly of FIG. 2A according to some embodiments of the invention.

As shown in FIGS. 2A, 2B, and 2C, the wiring substrate 204 can include test head connectors 208, which can be for receiving electrical connectors 114 and thereby making electrical connections with the test head 104 (see FIG. 1A). Test head connectors 208 may be, for example, zero-insertion-force connectors or pogo pads for engaging pogo pins from the test head 104. As shown in FIG. 4 (which shows a schematic depiction of wiring substrate 204 and probe head assembly 222), electrical paths 402 can be provided through the wiring substrate 204 to electrical connections 404, which in turn can be connected to electrical paths 406 through the probe head assembly 222 to the probes 224. The wiring substrate 204 and probe head assembly 222, along with electrical connections 404, thus provide a plurality of electrical paths between test head connectors 208 and probes 224.

Referring again to FIGS. 2A, 2B, and 2C, the wiring substrate 204 can be selected for its ability to provide electrical paths (402 in FIG. 4) as described above. For example, the wiring substrate 204 may be a printed circuit board material, which as known in the art, may comprise multiple layers (not shown) of an insulating material on which conductive traces (not shown) can be formed with vias (not shown) interconnecting traces (not shown) on different layers.

The probe head assembly 222 can be selected for its ability to function as a platform for the probes 224 and to provide electrical paths (406 in FIG. 4) to the probes 224. Probe head assembly 222 may be as simple as a single substrate with traces (not shown) and vias (not shown) forming electrical paths 406 (see FIG. 4). Alternatively, probe head assembly 222 may be more complex. For example, probe head assembly 222 may comprise a plurality of substrates.

Figure 5A:
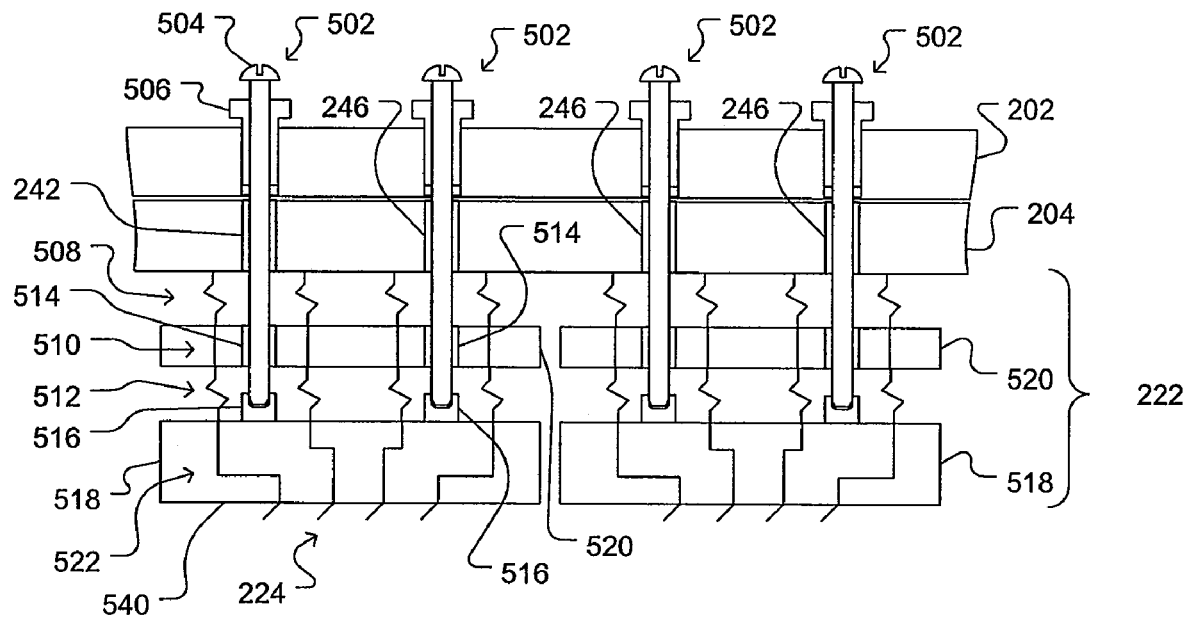
FIG. 5A illustrates an exemplary probe head assembly and exemplary attachment/adjustment mechanisms according to some embodiments of the invention.

FIG. 5A illustrates an example of a complex probe head assembly 222 that may be used with the probe card assembly 200 shown in FIGS. 2A, 2B, and 2C. In FIG. 5A, the probe head assembly 222 can include two space transformers 518 and two interposers 520. Each space transformer 518 can be mechanically attached to the stiffener plate 202 (shown in partial view only in FIG. 5A) by differential screw assemblies 502 (which will be described in more detail below). Each space transformer can include probes 224 for contacting an electronic device (not shown) to be tested. Interposers 520 can provide electrical connections between the wiring substrate 204 and the space transformers 518. Each interposer 520 can comprise a wiring board (e.g., made of printed circuit board material) and electrically conductive spring elements 512 and 508 extending from either side of the interposer 520 and electrical paths 510 (e.g., conductive vias) through the interposer 520 provide the electrical connections between the wiring substrate 204 and the space transformers 518. Conductive spring elements 512 and 508 may be any resilient, conductive structures. For example, conductive spring elements 512 and 508 can be like probes 224.

Space transformers 518 may be made of layers (not shown) of ceramic or organic material, and electrical paths 522 through the space transformers 518 may comprise conductive traces (not shown) on the layers (not shown) with vias (not shown) connecting traces on different layers. Nonlimiting examples of probe head assemblies that include at least one interposer and at least one space transformer are disclosed in U.S. Pat. Nos. 5,974,662, 6,483,328, and 6,509,751. The following disclose other examples of probe head assemblies that can be used as probe head assembly 222: U.S. Pat. Nos. 5,806,181, 6,690,185, 6,640,415, U.S. Patent Application Publication No. 2001/0054905, U.S. Patent Application Publication No. 2002/0004320, and U.S. Patent Application Publication No. 2002/0132501. As another example, probe head assembly can comprise a plurality of probe heads each having a probe array and positioned to form a large array of probes. In such a probe head assembly, each probe head can be independently positionable and adjustable. Non-limiting examples of such probe head assemblies are disclosed in U.S. patent application Ser. No. 11/165,833, entitled "Method And Apparatus For Adjusting A Multi-Substrate Probe Structure," filed Jun. 24, 2005.

Returning to a discussion of the probe card assembly 200 of FIGS. 2A, 2B, and 2C and referring now to the mechanical function that can be provided by the stiffener plate 202, as shown in FIGS. 2A, 2B, and 2C, mechanical fasteners 216 can mechanically attach the probe head assembly 222 to the stiffener plate 202. As shown in FIG. 2C, mechanical fasteners 216 pass through holes 242 in the wiring substrate 204. Consequently, the probe head assembly 222 is not attached directly to the wiring substrate 204. In this way, the wiring substrate 204 can also be thermally decoupled from the probe head assembly 222.

Mechanical fasteners 216 may comprise any suitable means for securing the probe head assembly 222 to the stiffener plate. For example, the mechanical fasteners 216 may be as simple as screws or bolts 216 (as shown in FIG. 2C) that pass through threaded holes (314 in FIG. 3B) in the stiffener plate and engage threaded holes (not shown) in the probe head assembly 222. Alternatively, the mechanical fasteners 216 may be more complicated structures that provide additional functions. FIG. 5A illustrates an example of mechanical fasteners that can be configured not only to secure the probe head assembly 222 to the stiffener plate 202 but also to control the orientation of the probe head assembly 222 (and thus the probes 224) with respect to the stiffener plate 202.

In FIG. 5A, the mechanical fasteners that secure probe head assembly 222 (interposers 510 and space transformers 518 in FIG. 5A) to the stiffener plate 202 can be differential screw assemblies 502. Each differential screw assembly 502 can include a screw (or bolt) 504 that threads into a nut 506 that is itself threaded into the stiffener plate 202. Thus, the inside of nut 506 is threaded to receive screw 504, and the outside of nut 506 is also threaded so that nut 506 can thread into stiffener plate 202. As shown in FIG. 5A, the screw 504 passes through a hole 242 in the wiring substrate 204 and a hole 514 in the interposer 520. The screw 504 threads into a threaded stud 516 attached to a space transformer 518. Hole 242 through the wiring substrate 204 can include extra space, which as will be discussed below, allows the wiring substrate 204 to move (e.g., expand and contract) with respect to the stiffener plate 202 and the probe head assembly 222.

By adjusting one of the nuts 506 of one of the assemblies 502, the portion of the space transformer 518 to which the corresponding threaded stud 516 is attached can be pulled toward the stiffener plate 202 or pushed away from the stiffener plate 202. By utilizing a plurality of such differential screw assemblies 502 each attached to a different portion of the space transformer 518, the planar orientation of the space transformer 518 with respect to the stiffener plate 202 may be adjusted.

Figure 5B:
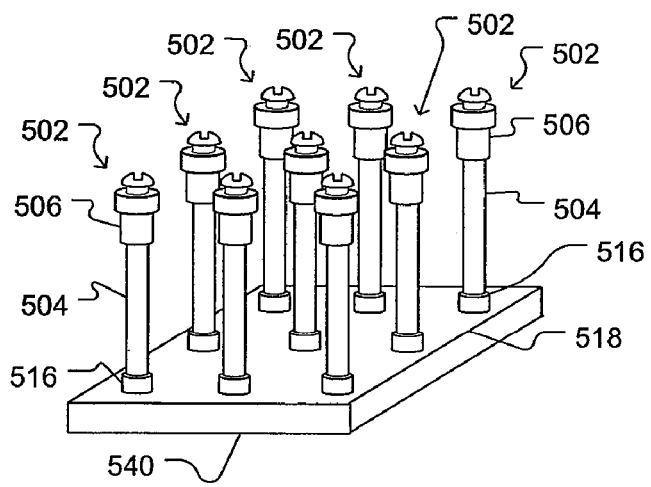
FIG. 5B illustrates an exemplary arrangement of attachment/adjustment mechanisms on a space transformer of the probe head assembly of FIG. 5A according to some embodiments of the invention.

FIG. 5B illustrates on exemplary space transformer 518 to which nine threaded studs 516 can be attached. FIG. 5B also shows nine screws 504 threaded into nine nuts 506 and the nine studs 516. (For clarity and ease of illustration, other elements, such as stiffener plate 202, are not shown in FIG. 5B. Nevertheless, as described above and shown in FIG. 5A, nuts 506 thread into stiffener plate 202.) Rotating a nut 506 in a first direction pulls the region of the space transformer 518 to which the corresponding threaded stud 516 is attached towards the stiffener plate 202. Conversely, rotating the nut 506 in the opposite direction pushes the region of the space transformer 518 to which the threaded stud 516 is attached away from the stiffener plate 202. As should be apparent, the planar orientation and even the shape of the surface 540 of the space transformer 518 to which the probes 224 are attached can be altered with respect to the stiffener plate 202. The pitch of the screws 502, and the corresponding pitch of the inner threads of the nut 506, and the pitch of the outer threads of the nut 506 can be selected to allow for fine adjustment of the positions of studs 516 with respect to stiffener plate 202.

Because, as shown in FIG. 2C, the stiffener plate 202 of the probe card assembly is attached to the head plate 121 of the prober 102 and the probes 224 (which may be disposed in a two-dimensional array) are attached to a space transformer 518 (which forms part of the probe head assembly 222 shown in FIG. 2C), adjusting the planar orientation or shape of the space transformer 518 with respect to the stiffener plate 202 adjusts the planar orientation of the tips of the probes 222 with respect to the head plate 121 so that, while the probe card assembly 200 is attached to the head plate 121, the tips can be planarized with respect to the terminals (not shown) of the dies being tested.

The number and placement of differential screw assemblies 502 shown in FIGS. 5A and 5B are exemplary only. More or fewer of such assemblies 502 may be used, and those assemblies 502 may be disposed in patterns other than the orientation shown in FIG. 5A and the orientation shown in FIG. 5B. The number and spacing of the studs 516 can be selected in any number of ways. For example, the number and spacing of the studs 516 can be selected using a solid model of the system and finite element analysis to perform a sensitivity study. Moreover, differential screw assemblies 502 need not be used. Indeed, other mechanisms for securing the probe head assembly 222 to the stiffener plate 202 may be used. For example, split nut differential screw assemblies may be used in place of the screw assemblies 502. The split nut can allow the threads to be preloaded, which may prevent backlash. As another example, some of the screw assemblies 502 may be replaced with assemblies that push the space transformer 518 away from the stiffener plate 202 but are not able to pull the space transformer 518 towards the stiffener plate 202.

Returning again to the discussion of the probe card assembly 200 of FIGS. 2A, 2B, and 2C, as shown in FIG. 2C, in the probe assembly 200, the stiffener plate 202—rather than the wiring substrate 204—can be configured to be secured to the test head plate 121 of the prober 102 (see FIG. 1B). In the exemplary probe card assembly 200 shown in FIGS. 2A, 2B, 2C, the stiffener structure 202 can include radial arms 210. As best seen in FIGS. 2B and 2C, the stiffener plate 202 also can include tabs 226 disposed in slots 302 in the wiring substrate 204. Holes 206 and 228 through the radial arms 210 and the tabs 226 correspond to the holes 134 in the test head plate 121 (see FIG. 1B), and the probe card assembly 200 can be attached to the test head plate 121 (see FIG. 1B) by bolts 142 that pass through the holes 206 and 228 in the radial arms 210 and tabs 226 and through holes 134 in the tester head plate 121. (In FIG. 2C, the prober head plate 121 is shown in dashed lines as are bolt/nut pairs for bolting the probe card assembly 200 to the prober head plate 121.)

It should thus be apparent that, because the stiffener plate 202 is bolted to the test head plate 121 and the probe head assembly 222 is attached to the stiffener plate 202, the stiffener plate 202 can provide mechanical stability to the probe head assembly 222. The stiffener plate 202 may be selected for its strength and ability to resist thermal movement. For example, the stiffener plate 202 (and tabs 226) may comprise metal (e.g., aluminum), which is typically stronger and more resistant to movement, bowing, warping, etc. than a wiring substrate 204 would be (e.g., as discussed above, the wiring substrate 204 is typically made of printed circuit board materials). Other non-limiting examples of materials from which the stiffener plate 202 (and tabs 226) can be made include steel, titanium, nickel, ex invar, kovar, graphite epoxy, metal matrix materials, ceramics, etc. In addition, alloys of any of the foregoing materials or mixtures of any of the foregoing materials with other materials can be used. It should be apparent that the stiffener plate 202 and tabs 226 can form a metallic structure that attaches the probe head assembly 222 to the prober head plate 121.

FIGS. 2A, 2B, 2C, 3A, and 3B also illustrate another technique that may be implemented to reduce thermally induced movement of the probes 224. As mentioned above, typical wiring substrates 204 can be susceptible to thermally induced movement. In the example illustrated in FIGS. 2A, 2B, 2C, 3A, and 3B, the wiring substrate 204 can be attached to the stiffener plate 202 such that the wiring substrate 204 can expand and contract radially. That is, the wiring substrate 204 can move radially with respect to the stiffener plate 202 and the probe head assembly 222. This reduces the forces on the stiffener plate 202 caused by expansion or contraction of the wiring substrate 204 in response to changes in the ambient temperature.

As shown in FIGS. 2A and 2C, the wiring substrate 204 can be secured to the stiffener plate 202 at one location (e.g., generally at the center) of the wiring substrate 204. As shown in FIGS. 2A, 2C, 3A, and 3B, a screw or bolt 214 may be used to secure the wiring substrate 204 to the stiffener plate 202. Such a screw or bolt 214 may pass through (or thread through) hole 316 (see FIG. 3B) in the stiffener plate 202 and thread into a threaded hole (or insert) 252 in the wiring substrate 204 (see FIG. 3A).

Spaces and other provisions can be provided for allowing the wiring substrate 204 to expand radially away from the screw 214 or contract radially toward the screw 214. For example, in FIGS. 2A, 2B, and 2C, additional bolts 212 and nuts 232 prevent the wiring substrate 204 from rotating with respect to the stiffener plate 202. As best seen in FIG. 3A, the holes 246 in the wiring substrate 204 through which the bolts 212 pass can be elongate to provide space for expansion and contraction of the wiring substrate 204. Extra space can similarly be provided in the holes 242 in the wiring substrate 204 through which the mechanical fasteners 216 pass that secure the probe head assembly 222 to the stiffener plate 202. The extra space allows the wiring substrate 204 to expand and contract. Extra space may similarly be provided in the slots 302 in the wiring substrate 204 to allow for expansion and contraction of the wiring substrate 204. Lubrication, bearings, or other means (not shown) may optionally be provided on surfaces of the wiring substrate 204 to facilitate movement of the wiring substrate 204 with respect to the stiffener plate 202 and the probe head assembly 222.

FIG. 6 illustrates a simplified block diagram of another exemplary probe card assembly 600 configured to resist thermal movement according to some embodiments of the invention. The probe card assembly 600 can be generally similar to probe card assembly 200 but with the addition of truss structure 604. The stiffener plate 202, wiring substrate 204, and probe head assembly 222 of probe card assembly 600 can be the same as like named and numbered elements in probe card assembly 200 and, for simplicity and ease of illustration, are shown in FIG. 6 in block diagram format without the details shown and discussed above with respect to probe card assembly 200. As shown in FIG. 6 (which shows a side view of probe card assembly 600), a truss structure 604 can be secured to the stiffener plate 202. As will be seen, truss structure 604 can be an additional stiffening structure that helps probe card assembly 600 further resist thermally induced "z" movement and/or mechanical movement.

Figure 7A:
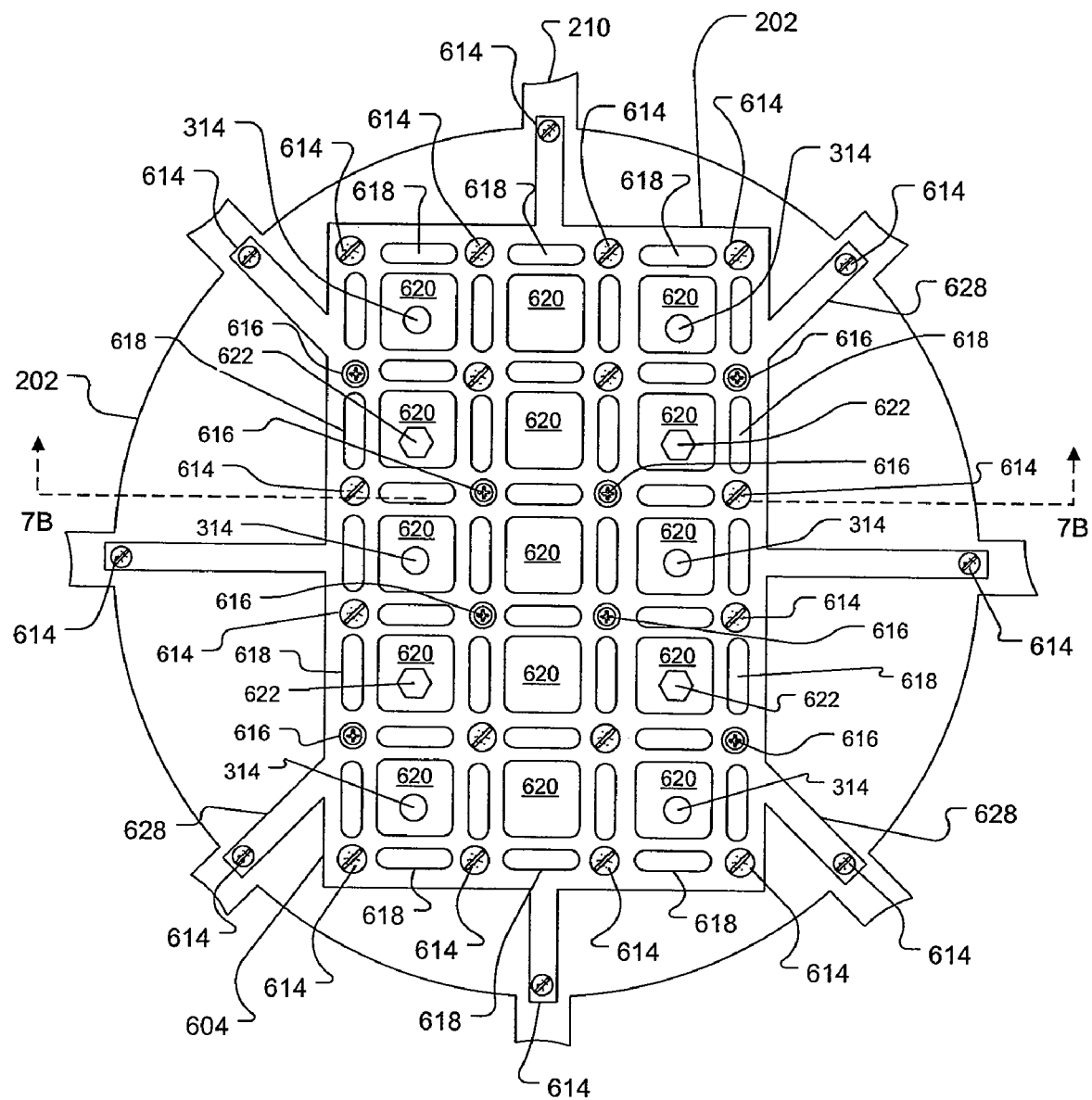
FIG. 7A shows a top view of the truss structure and stiffener plate of the probe card assembly of FIG. 6 according to some embodiments of the invention.
Figure 7B:
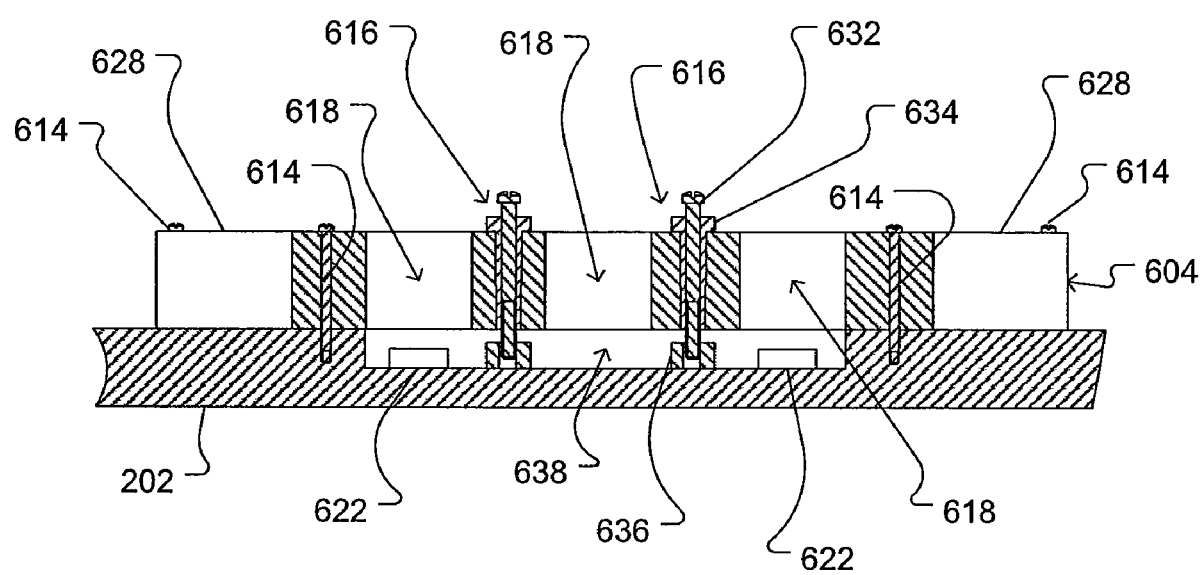
FIG. 7B shows a side cross-sectional view of the truss structure and stiffener plate of the probe card assembly of FIG. 6 according to some embodiments of the invention.

FIG. 7A and FIG. 7B, which show only the truss structure 604 and the stiffener plate 202, illustrate details of an exemplary truss structure 604. (FIG. 7A shows a top view and FIG. 7B shows a cross-sectional side view of the truss structure 604 and the stiffener plate 202.)

As shown in FIGS. 7A and 7B, truss structure 604 can be secured to the stiffener plate 202. The truss structure 604 may be secured to the stiffener plate 202 using any suitable means. In FIGS. 7A and 7B, a plurality of screws (or bolts) 614 pass through holes (not shown) in the truss structure 604 and thread into corresponding holes (not shown) in the stiffener plate 202. In the exemplary truss structure 604 shown in FIGS. 7A and 7B, some of screws 614 pass through the body of the truss structure 604 and some of screws 614 pass through arms 628 that extend from the body of the truss structure 604.

Truss structure 604 can be designed to create, in combination with stiffener plate 202, a composite structure having a stiffness-per-weight ratio that can be greater than could be achieved if truss structure 604 and stiffener plate 202 were a single, solid structure. Truss structure 604 can include empty spaces rather than being solid. The exemplary truss structure 604 shown in FIGS. 7A and 7B can include a plurality of generally square shaped empty spaces 620 and a plurality of generally rectangular or flatted-oval shaped empty spaces 618. Of course, however, the number and shape of the empty spaces is not critical and any number and shape of empty spaces may be used. The empty spaces 618, 620 may provide access to mechanical fasteners 216 (not shown in FIG. 6, 7A, or 7B). For example, in FIG. 7A, holes 314 in stiffener plate 202 for mechanical fasteners 216 can be visible through some of the square-shaped empty spaces 620.

Because the structure 604 can include empty spaces 618 and 620, it is not as heavy as a solid structure would be. The mechanical strength—that is, the stiffness contribution—can be, however, generally a function of the thickness of the structure 604. Thus, the fact that the structure 604 has empty spaces 618 and 620 means that, for a given thickness, the truss structure 604 weighs less than a solid structure but can provide generally the same amount of mechanical strength as a solid structure.

Because the truss structure 604 adds stiffening strength to the probe card assembly 200, the stiffener plate 202 may be made thinner. Generally speaking, the thinner the stiffener plate 202, the shorter the thermal equilibrium time of the probe assembly 600. As discussed above, immediately following installation of a probe card assembly in a prober (e.g., 102 of FIG. 1A) with a heated (or cooled) stage 106, the probe card assembly typically undergoes thermally induced movement. The position of the probe card assembly stabilizes (that is, significant movement of the probe card assembly stops) only after a sufficient temperature equilibrium is reached between the front and back-sides of the probe card assembly. (In FIG. 6, the front-side is labeled 690 and the back-side is labeled 692.) As also noted above, such an equilibrium need not be a perfect equilibrium in which the front-side temperature of the probe card assembly equals the back-side temperature; rather, the front-side temperature and the back-side temperature need only be sufficiently close that appreciable movement of the probe card assembly stops. As noted above, the time required to reach such a temperature equilibrium or near equilibrium is often referred to as thermal soak time or thermal equilibrium time. The thinner the stiffener plate 202, the less the thermal mass of the stiffener plate 202, and hence the shorter the time to heat (or cool) the stiffener plate 202 to equal or approximately equal the temperature at the front-side of the probe card assembly 600. Hence, the thinner the stiffener plate 202, the shorter the thermal equilibrium time.

The thermal equilibrium time of the probe card assembly 600 may be further reduced by placing thermally resistive material (not shown) between the stiffener plate 202 and the truss structure 604. The thermally resistive material (not shown) can thermally isolate the truss structure 604 from the stiffener plate 202 to eliminate or reduce any contribution by the truss structure 604 to thermal equilibrium time. Because the truss structure 604 is thermally isolated from the stiffener plate 202, only the stiffener plate 202—but not also the truss structure 604—need reach approximate temperature equilibrium (as discussed above) with the front-side (die-side) of the probe card assembly.

Moreover, because the truss structure 604 has empty spaces 618 and 620, the truss structure 604 can act like a radiator and therefore can remain generally at or close to ambient temperature. This is because the spaces 618 and 620 in the truss structure 604 can allow air to circulate about the truss structure 604 and carry off any excess heat that builds up in the truss structure 604 (or warm the truss structure 604 if the air is warmer than the truss structure 604). This means that the truss structure 604 itself is unlikely to undergo appreciable levels of thermally induced movements (in either the "z" or the "z, y" directions), which further removes the truss structure 604 from contributing to (and thus increasing) the thermal equilibrium time of the probe card assembly 600.

Referring again to FIG. 6, during test, the electronic device 680 being tested can, of course, be positioned to the front-side 690 of the probe card assembly 600. If the electronic device 680 is heated, the heat source (not shown) can be also at the front-side 690 of the probe card assembly 600. A thermal gradient can thus be created from the front-side 690 to the back-side 692 of the probe card assembly 600. Such a thermal gradient is represented in FIG. 6 by arrow 682, where the direction of the arrow indicates decreasing temperature. If values for the thermal gradient 682 are known or can be approximated, the materials for the probe head assembly 222, stiffener plate 202, and truss structure 604 can be selected so that each expands or contracts by the same amount. That is, the probe head assembly 222 can be made of a material with a low coefficient of thermal expansion such that it expands approximately a specified distance "d" in response to its expected temperature in the temperature gradient 682. The stiffener plate 202, which will be at a lower temperature than the probe head assembly 222, can be made of a material with a higher coefficient of thermal expansion so that it also expands the same specified distance "d" in response to its (lower) expected temperature in the temperature gradient 682. The truss structure 604, which will be at an even lower temperature than the stiffener plate 202, can be made of a material with an even higher coefficient of thermal expansion so that it also expands the same specified distance "d" in response to its (even lower) expected temperature in the temperature gradient 682.

As shown in FIGS. 7A and 7B, the probe card assembly 600 may include adjustment mechanisms 616 for adjusting the position of the stiffener plate 202 with respect to the truss structure 604. The adjustment mechanisms 616 illustrated in FIGS. 7A and 7B can be differential screw assemblies, each including a screw 632 that threads into a threaded nut 634 that is itself threaded into truss structure 604 as generally described above with respect to differential screw assemblies 502. That is, the screw 632 also threads into a threaded stud 636 attached to the stiffener plate 202. As also described above with respect to differential screw assemblies 502, rotation of the nut 634 in one direction pulls the threaded stud 636 (and thus the portion of the stiffener plate 202 to which the stud 636 is attached) toward the truss structure 604, and rotation of the nut 634 in the opposite direction pushes the threaded stud 636 (and thus the portion of the stiffener plate 202 to which the stud 636 is attached) away from the truss structure 604. As should be apparent, the use of a plurality of such adjustment mechanisms 616 (e.g., differential screws) disposed at various locations on the truss structure 604 and stiffener plate 202, allows the planar orientation and even the shape of the stiffener plate 202 to be adjusted with respect to the truss structure 604.

The use of differential screw assemblies as adjustment mechanisms 616 are exemplary only; other mechanisms for adjusting the planar orientation of the stiffener plate 202 with respect to the truss structure 604 may be used. For example, one or more of the differential screw assemblies (e.g., 616) may be replaced with a mechanism for only pushing the stiffener plate 202 away from the truss structure 604. For example, the threaded stud 636 may be removed, such that the screw 632 presses against the stiffener plate 202 or against a mechanical element (e.g., a metal ball) disposed between the screw 632 and the stiffener plate 202. In such a configuration, turning the screw 632 in a first direction causes the screw 632 to press against the stiffener plate 202 and thus push the stiffener plate 202 away from the truss structure 604. Turning the screw 632 the opposite direction, however, simply withdraws the screw 632 from the stiffener plate 202 without pulling on the stiffener plate 202. A spring-loaded mechanism (not shown) can be provided to bias stiffener plate 202 toward truss 604. Regardless of the type of adjustment mechanism 616 used, more or fewer adjustment mechanisms 616 than shown in FIGS. 7A and 7B may be used.

Adjustment mechanisms 616 may be used to adjust the planar orientation and/or shape of the stiffener plate 202 with respect to the truss structure 604 after manufacture of the probe card assembly 600 and/or between uses of the probe card assembly 600 to test dies (not shown). In addition, the adjustment mechanisms 616 may be used to adjust the stiffener plate 202 before bolting the probe card assembly 600 to the test head plate 121 of a prober 102, while the probe card assembly 600 is bolted to the test head plate 121, or after removing the probe card assembly 600 from the test head plate 121.

The adjustment mechanisms 616 may also be used to adjust the stiffener plate 202 during testing of dies (not shown) to counteract thermally induced movement of the stiffener plate 202 (or any other portion of the probe card assembly 600). In response to detected movement of the probes 224 during testing of dies (not shown), the adjustment mechanisms 616 may be selectively activated to push or pull against selected regions of the stiffener plate 202 (as described above) to counteract the detected movement (that is, move the stiffener plate 202 such that the probes 224 move back into their original positions).

Detection of movement of the probes 224 may be accomplished directly or indirectly in any suitable manner. For example, sensors may be used to detect such movement. In the example shown in FIGS. 7A and 7B, strain gauges 622 can be disposed on the stiffener plate 202, which can include a cavity 638, to monitor the level of strain at particular locations on the stiffener plate 202. Four such sensors 622 are illustrated in FIG. 7A, although more or fewer sensors 622 may be used. Because the probe head assembly 222 is attached directly to the stiffener plate 202, monitoring strain on the stiffener plate 202 indirectly monitors movement of the probes 224. If sufficient strain is detected on the stiffener plate 202 to indicate that the probes have moved or are likely to move, the adjustment mechanisms 616 may be selectively activated to counteract the detected strain and/or predicted movement. Of course, sensors 622 other than strain gauges may be used. Examples of other sensors include laser-based sensors for monitoring movement of the probes 224 or another part of the probe card assembly 600 and sensors for monitoring the electrical resistance of the contact connections between the probes 224 and the dies (not shown).

Figure 8:
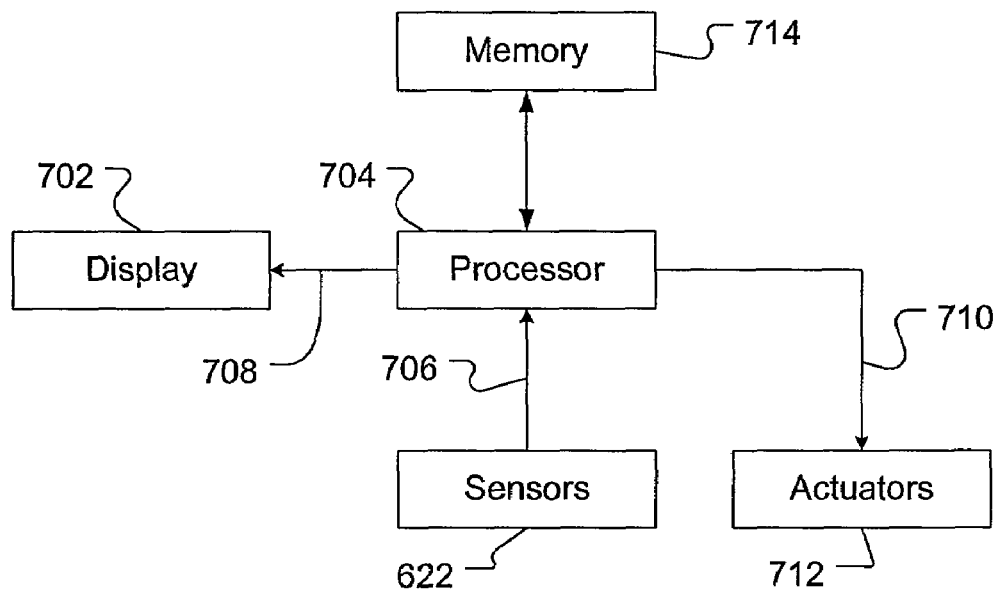
FIG. 8 illustrates a block diagram of a system for automatically adjusting an orientation of the stiffener plate with respect to the truss structure of FIG. 7A according to some embodiments of the invention.

FIG. 8 illustrates a system for monitoring movement or deformation of the stiffener plate 202 and adjusting the stiffener plate 202 to counteract the movement or deformation. Output 706 from sensors 622 (e.g., strain gauges) can be processed by a processor 704 and the results can be output 708 to a display 702. The processor 704 may be, for example, a microprocessor or controller running under software (including without limitation firmware or microcode) control, and the display 702 may be a typical computer display. A human operator may watch the display 702 and, after determining that the stiffener plate 202 is undergoing movement or deformation, manipulate the adjustment mechanisms 616 to counteract the movement or deformation. FIG. 8 also shows another alternative in which the processor 704 outputs control signals 710 to drive actuators 712 that turn nuts 634 to adjust the stiffener plate 202. For example, such actuators 712 may be precision stepper motors (not shown).

Figure 9A:
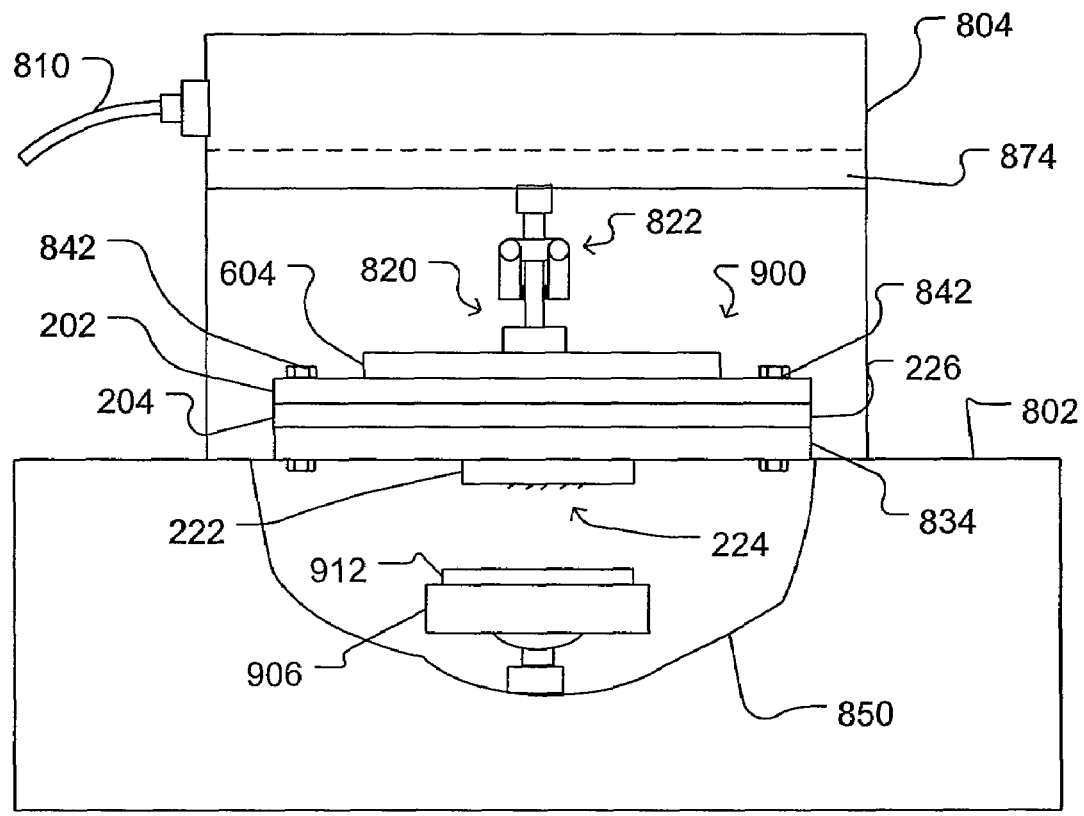
FIG. 9A illustrates yet another exemplary probe card assembly according to some embodiments of the invention. The probe card assembly is shown installed in an exemplary prober according to some embodiments of the invention.
Figure 9B:
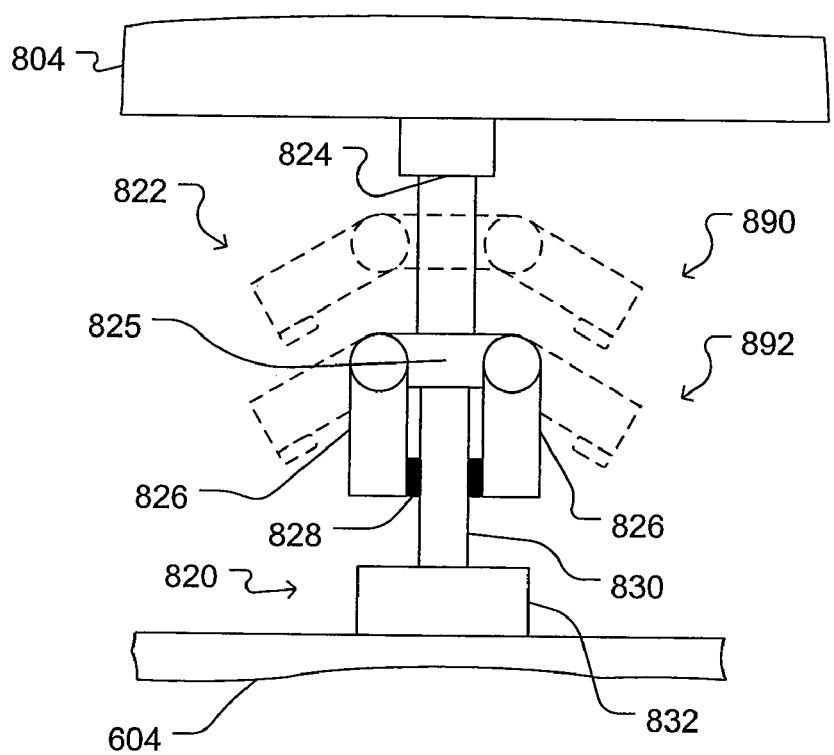
FIG. 9B shows a detailed view of the stud structure and gripper of FIG. 9A.

FIGS. 9A and 9B illustrate yet another exemplary probe card assembly 900 (which is shown in a prober 802). Probe card assembly 900 can be generally similar to probe card assembly 600 and can include a probe head assembly 222, wiring board 204, stiffener plate 202, and truss structure 604 that can be the same as like named and numbered elements of probe card assembly 600. As shown in FIG. 9A, probe card assembly 900 may also include a stud structure 820 that can be secured to the truss structure 604. A moveable gripper 822 can be attached to the test head 804, which may otherwise be similar to test head 104 in FIG. 1A (e.g., a cable 810 or other communications media connects the test head 804 to a tester (not shown)). The prober 802 may also be similar to prober 102 of FIG. 1A. As shown in FIG. 9A, the probe card assembly 900 can be bolted via bolts 842 to a prober head plate 834, which may be similar to prober head plate 121 in FIG. 1A. Note that FIG. 9A includes cutout 850 to reveal probe head assembly 222 and stage 906 with dies 912. Stage 906 can be like stage 106 of FIG. 1A, and dies 912 to be tested can be dies of an unsingulated semiconductor wafer (e.g., like wafer 112 of FIG. 1A), singulated dies (e.g., held in a carrier (not shown)), dies forming a multi-chip module, or any other arrangement of dies to be tested.

As also shown in FIG. 9A, once the probe card assembly 900 is bolted (842) to the prober head plate 834, the gripper 822 can grip the stud structure 820. The gripper 822 can be attached to the test head 804 and thus adds the strength of the test head 804 in resisting thermally induced movement of the probe card assembly 900. As shown in FIG. 9A, the gripper 822 may be attached to a rigid bar, plate, or other structure 874 built into the test head 804.

As shown in FIG. 9B, the stud structure 820 can include a stud 830 and an attachment base 832 that can be attached to truss structure 604 by bolts, welding, or any other suitable means (not shown). The gripper 822 can include an actuator 824 that moves vertically (relative to FIG. 9B) and may also be capable of horizontal and/or rotational movement. A rigid plate 825 can be attached to the actuator 824, and moveable arms 826 can be attached to the rigid plate 825. Each moveable arm 826 can include a gripper pad 828.

Initially, actuator 824 can position the gripper 822 out of the way, as shown by dashed lines 890 in FIG. 9B. After the probe card assembly 900 is bolted 842 to the prober head plate 834 (the probe card assembly 900 is shown bolted 842 to the prober head plate 834 in FIG. 9A), the actuator 824 can align the gripper 822 with the stud 830, as shown by dashed lines 890 in FIG. 9B. The actuator 824 can then move the gripper 822 such that the rigid plate 825 abuts against the stud 830, as shown by dashed lines 892 in FIG. 9B. Moveable arms 826 can then be moved such that gripper pads 828 grip the stud 830, as shown by the solid lines in FIG. 9B and in FIG. 9A. As mentioned above, the strength of the test head 804 can thus be brought to bear against thermally induced "z" movement of the probe card assembly 900.

Figure 10A:
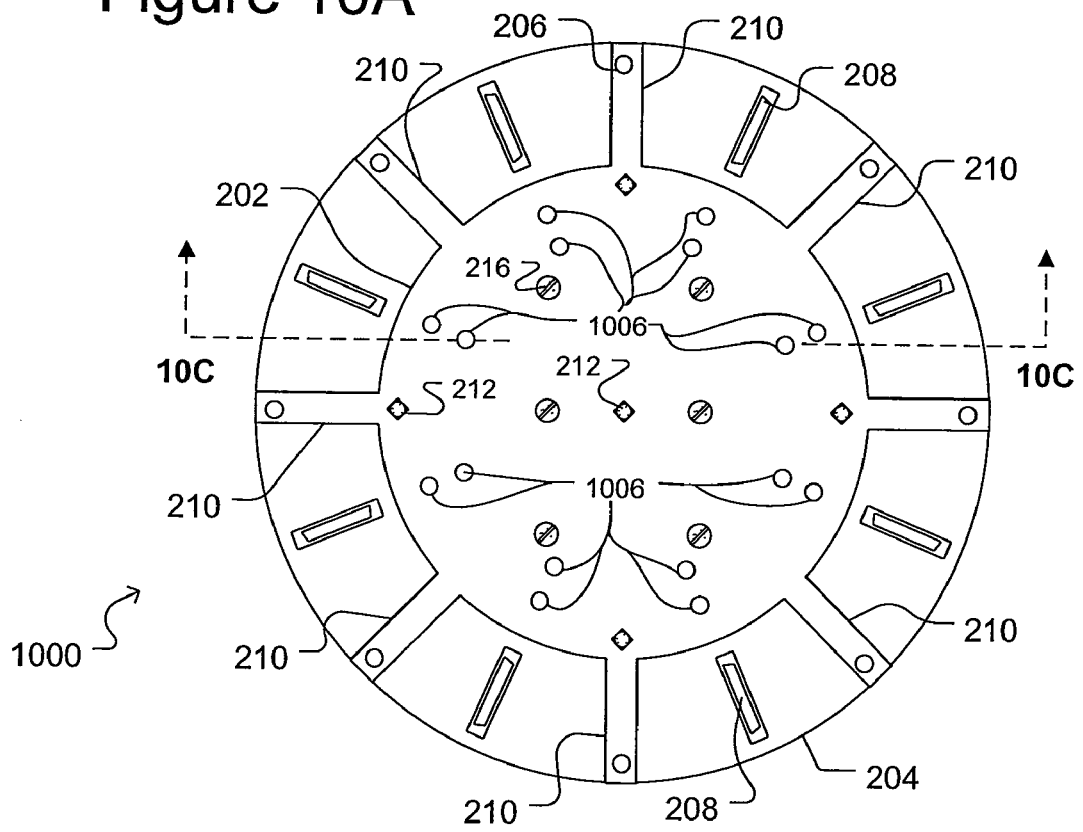
FIG. 10A shows a top view of still another exemplary probe card assembly according to some embodiments of the invention.

FIGS. 10A, 10B, and 10C illustrate still another exemplar probe card assembly 1000, which as shown in FIGS. 10A, 10B, and 10C, can include a probe head assembly 222, wiring substrate 204, and stiffener plate 202 similar to like named and numbered elements of probe card assembly 200. As shown in FIGS. 10B and 10C, the probe card assembly 1000 also can include a heat sink 1002 disposed on the front-side the probe card assembly 1000. The heat sink 1002, which can include an opening 1004 for probe head assembly 222, can be made of a material with a high thermal conductivity and can be attached to the stiffener plate 202 with attachment elements 1006 that also have a high thermal conductivity. In the example shown in FIG. 10C, each attachment element 1006 can include a screw 1008 that threads into a threaded stud 1014 on the heat sink 1002. The screw 1008 passes through a threaded hole (not shown) in the stiffener plate 202 and a hole 1012 in the wiring substrate 204. The hole 1012 in the wiring substrate may include extra space to allow the wiring substrate to expand and contract as discussed above with respect to FIGS. 2A, 2B, and 2C. The threaded studs 1014 can abut against the stiffener plate 202, and the studs 1014 and screws 1008 can be made of a thermally conductive material.

It should be apparent that the heat sink 1002 and the thermally conductive attachment elements 1006 can provide a plurality of paths with a high thermal conductivity from the front-side of the probe card assembly 1002 to the stiffener plate 202 (the back-side of the probe card assembly 1002). While the probe card assembly 1000 is bolted into a prober (e.g., like probe card assembly 900 in FIG. 9A), the heat sink 1002 thus faces the stage (e.g., 906 in FIG. 9A) that holds the dies (not shown) being tested. If the stage is heated or cooled, or if the dies (not shown) generate or sink significant heat during testing, the heat sink 1002 and attachment elements 1006 can thus provide a plurality of paths with low thermal resistance to conduct heat from the front-side of probe card assembly 1000 to the back-side of the probe card assembly 1000 or from the back-side to the front-side. This can decrease the time required for the front-side and the back-side of the probe card assembly 1000 to reach temperature equilibrium and thus reduce the thermal equilibrium time of the probe card assembly 1000. This can also help maintain a temperature equilibrium between the front-side and the back-side of the probe card assembly 1000 during testing. The mechanical fasteners 216 that attach the probe head assembly 222 to the stiffener plate 202 (see FIG. 2C) may also comprise a thermally conductive material and thus provide additional paths with low thermal resistance for conducting heat from the probe head assembly 222 (at the front-side of the probe card assembly 1000) to the stiffener plate 202 (at the back-side of the probe card assembly 1000).

Although not shown in FIG. 10A, 10B, or 10C, a thermally insulating material (not shown) may be placed around the stiffener plate 202 to slow or prevent heat transferred through the thermally conductive paths discussed above (e.g., the heat sink 1002 and thermally conductive attachment elements 1006 and/or the probe head assembly 222 and the mechanical fasteners 216) to the stiffener plate 202 from being lost to the ambient air around the stiffener plate 202. If a truss structure 604 is attached to the stiffener plate 202 (as in FIG. 6), the thermally insulating material (not shown) may also be placed around the truss structure 604. Although also not shown in FIG. 10A, 10B, or 10C, thermal diodes could be placed in the thermally conductive paths between the heat sink 1002 and the stiffener plate 202 and configured to switch off and thus stop the conduction of thermal energy while temperature equilibrium between the front-side and back-side of the probe card assembly 1000 (or another predetermined condition) is achieved.

Figure 11A:
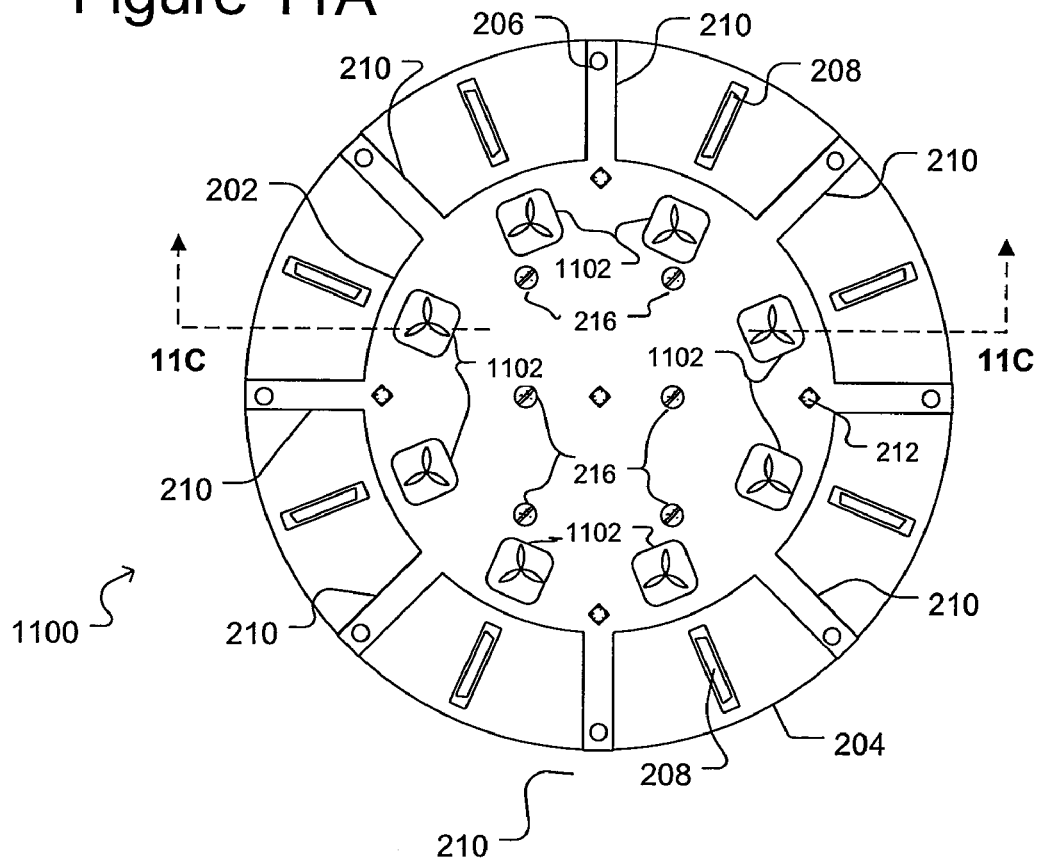
FIG. 11A shows a top view of a further exemplary probe card assembly according to some embodiments of the invention.
Figure 11B:
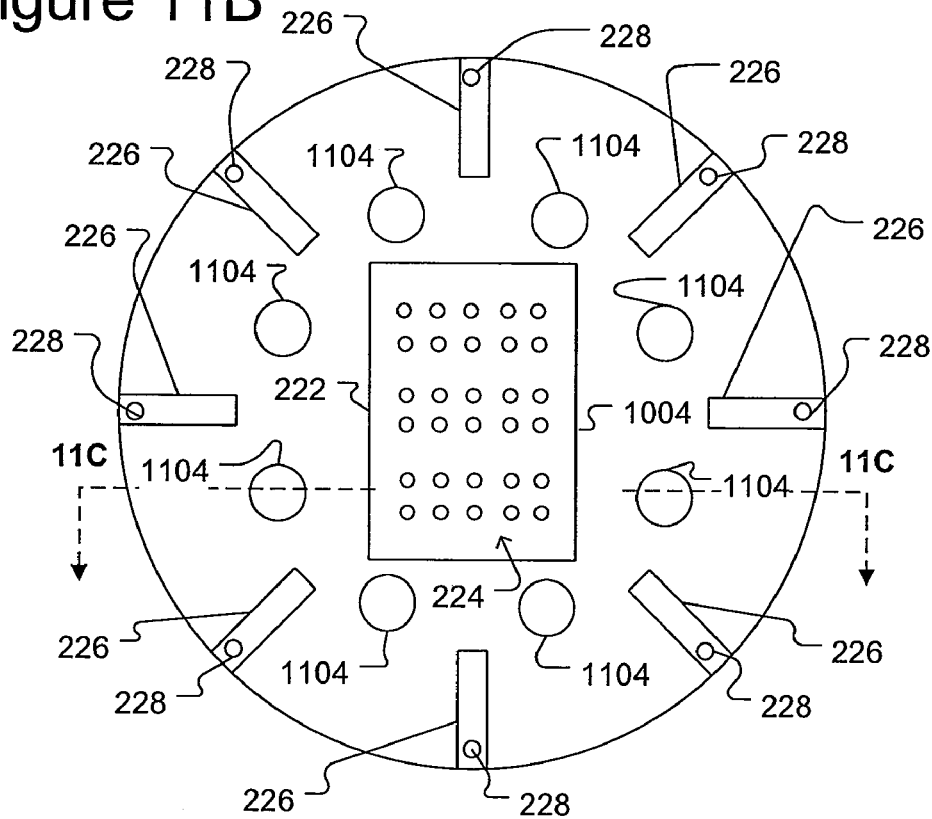
FIG. 11B illustrates a bottom view of the probe card assembly of FIG. 11A.

The exemplary probe card assembly 1100 shown in FIGS. 11A, 11B, and 11C shows an alternative to a heat sink 1002. In the exemplary probe card assembly 1100, fans 1102 pull air from the front-side of the probe card assembly 1100 to the back-side of the probe card assembly 1100. As shown in FIGS. 11A, 11B, and 11C, the fans 1102 pull air from the front-side of the probe card assembly 1100 through passages 1104 and 1106 in the wiring substrate 204 and stiffener plate 202 to the back-side of the probe card assembly 1100. (Arrows 1110 show the direction of air flow.) Again, this can decrease the time required for the front-side and the back-side of the probe card assembly 1100 to reach temperature equilibrium and thus reduce the thermal equilibrium time of the probe card assembly 1100. This can also help maintain a temperature equilibrium between the front-side and the back-side of the probe card assembly 1100 during testing, which can eliminate or at least reduce thermally induced movement of the probe card assembly 1100 during testing of dies (not shown). Of course, each of air-flow passages 1104 and 1106 could be replaced with multiple smaller passages. Fans 1102 and passages 1104, 1106 can thus conduct heat from the front-side of probe card assembly 1100 to the back-side of the probe card assembly 1100 or from the back-side to the front-side.

Figure 12B:
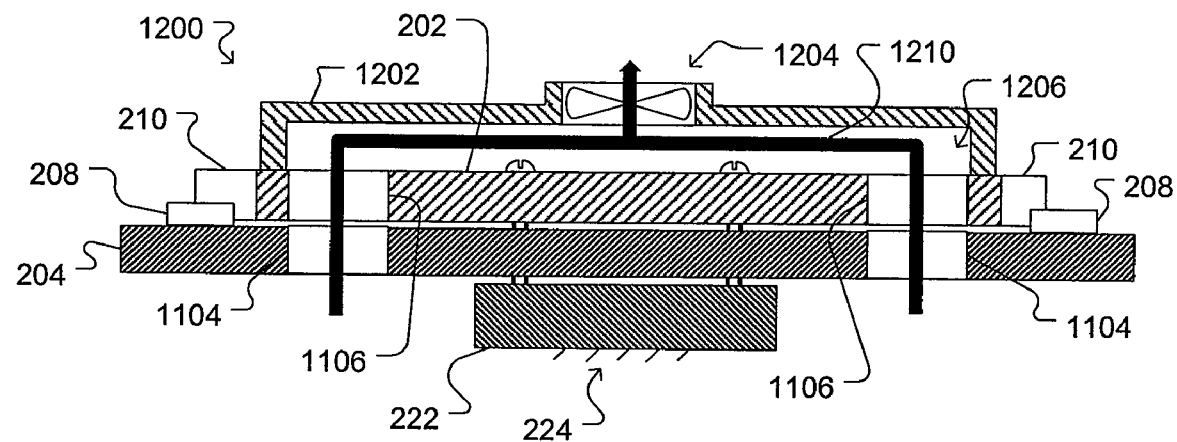
FIG. 12B illustrates a side cross-sectional view of the probe card assembly of FIG. 12A.

FIGS. 12A and 12B illustrate a probe card assembly 1200 that can be generally similar to probe card assembly 1100 of FIGS. 11A, 11B, and 11C except that fans 1104 can be replaced by fan 1204 located in a cover 1202. That is, a cover 1202 can be attached to the stiffener plate 202, forming a cavity 1206 as shown in FIG. 12B. Fan 1204 draws air from the front-side of probe card assembly 1200 through passages 1104 and 1106 in the wiring substrate 204 and stiffener plate 202. As shown in FIG. 12B, the air also passes through the cavity 1206, and as it does so passes over the stiffener plate 202. (Airflow is shown by arrow 1210.) Again, this can decrease the time required for the front-side and the back-side of the probe card assembly 1200 to reach temperature equilibrium and thus reduces the thermal equilibrium time of the probe card assembly 1200. This can also help maintain a temperature equilibrium between the front-side and the back-side of the probe card assembly 1200 during testing, which can eliminate or at least reduce thermally induced movement of the probe card assembly 1200 during testing of dies (not shown). Fan 1204 and passages 1104, 1106 can thus conduct heat from the front-side of probe card assembly 1200 to the back-side of the probe card assembly 1200 or from the back-side to the front-side. Each of air-flow passages 1104 and 1106 could be replaced with multiple smaller passages.

Figure 13A:
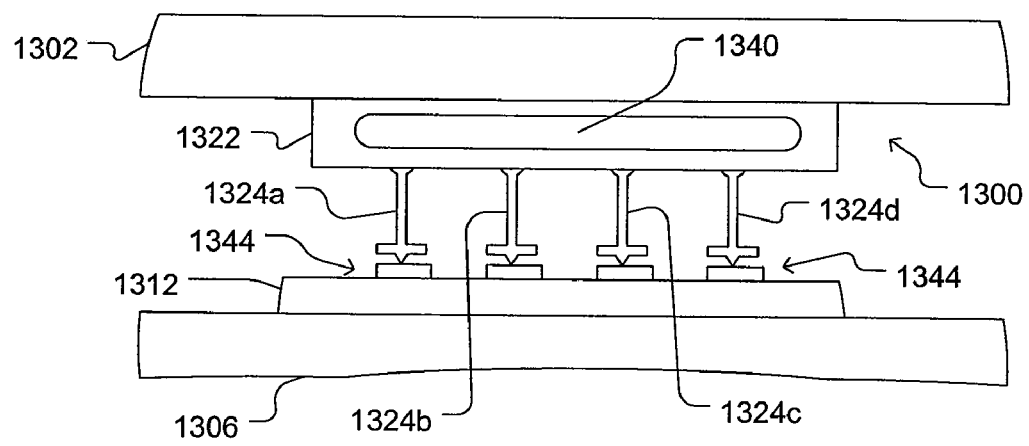
FIGS. 13A, 13B, and 13C show side partial views of still another exemplary probe card assembly and a stage with a wafer to be tested according to some embodiments of the invention.
Figure 13B:
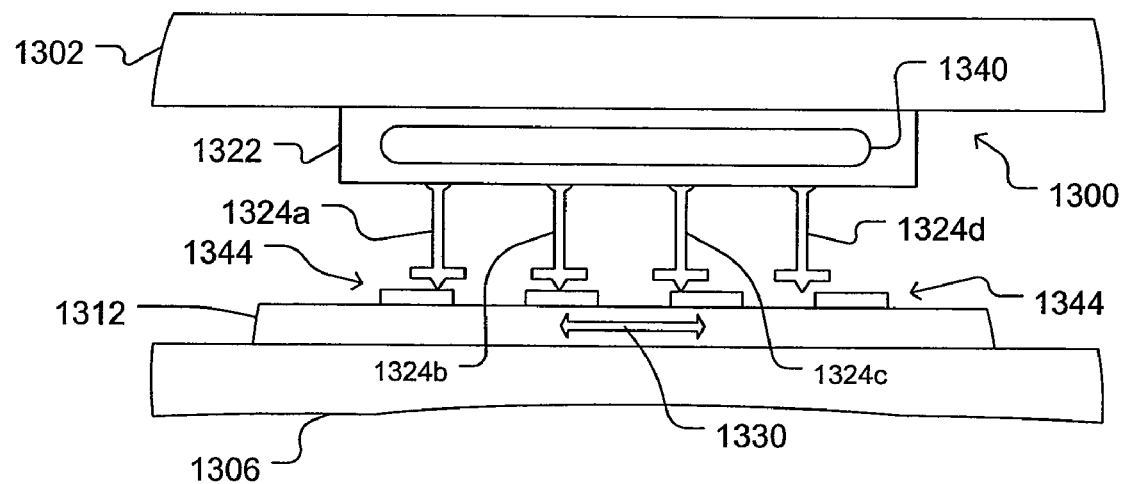
Figure 13C:
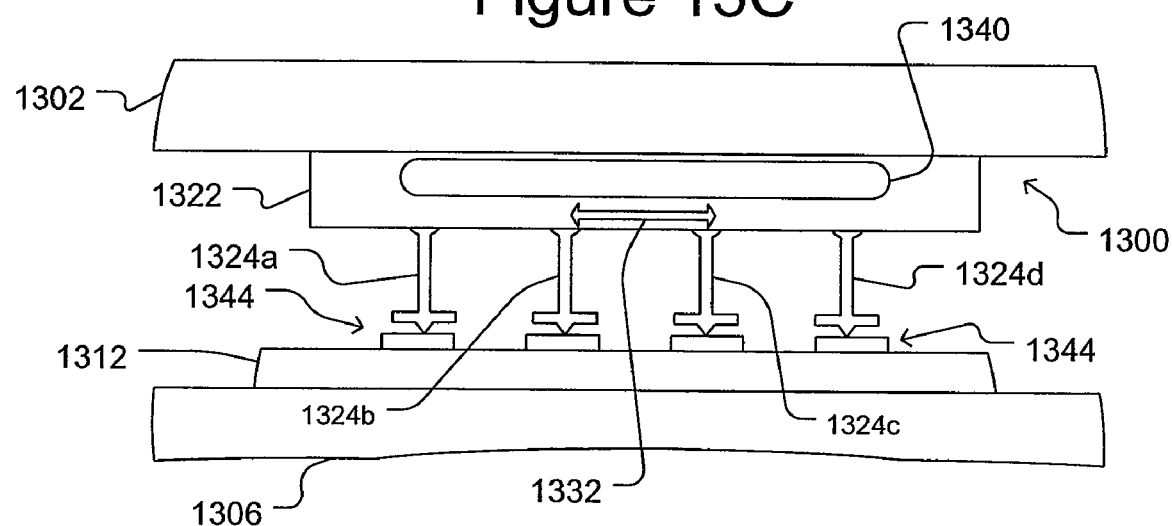

FIGS. 13A, 13B, and 13C show another exemplary probe card assembly 1300. The probe card assembly 1300 can include a mounting/wiring structure 1302 and a probe head assembly 1322 with probes (probes 1324a-d are shown), which can be generally the same as probes 224. The mounting/wiring structure 1302 (which is shown in partial view in FIGS. 13A, 13B, and 13C) can provide both electrical wiring to and from the probe head assembly 1322 and a structure for mounting to a prober. The mounting/wiring structure 1302 is shown generically in FIGS. 13A, 13B, and 13C because it is intended that any structure suitable for both providing wiring to the probe head assembly 1322 and a structure for mounting to a prober be represented. For example, the mounting/wiring structure 1302 may be as simple as a standard wiring substrate, like wiring substrate 120 of FIG. 1A. Alternatively, mounting/wiring structure 1302 may comprise one or more of a wiring board, stiffener plate, truss structure, and stud structure similar to and configured like the wiring substrate 204 and stiffener plate 202 of FIGS. 2A, 2B, and 2C, the truss structure 604 of FIGS. 7A and 7B, and the stud structure 820 of FIGS. 9A and 9B. As yet another example, mounting/wiring structure 1302 may comprise a coaxial cable interface (not shown) or other such connector for interfacing with a tester (not shown). An example of a coaxial cable interface (not shown) is disclosed in U.S. Patent Application Publication No. 2002/0195265.

Probe head assembly 1322 may be generally similar to probe head assembly 222 in FIGS. 2A, 2B, and 2C, and probes 1324a-d may be similar to probes 224 in FIGS. 2A, 2B, and 2C. As shown in FIGS. 13A, 13B, and 13C, the probe head assembly 1322 additionally can include one or more temperature control device 1340.

It is sometimes desirable to test semiconductor dies over a range of operating temperatures. That is, while test signals can be passed to and from the dies via the probe card assembly, the temperature of the dies is changed from a lower temperature to a higher temperature (or visa versa). There is a potential problem, however. Because the dies and the probe head assembly can be typically made of different materials with different coefficients of thermal expansion, the dies and the probe head assembly expand or contract at different rates in response to the changing temperature. For example, a probe head assembly may be made of a ceramic material which can have a higher coefficient of thermal expansion than silicon, which is a typical material of dies.

FIGS. 13A and 13B illustrate this problem. In FIG. 13A, the probes 1324a-d of probe card assembly 1300 can be brought into contact with terminals 1344 of one or more dies 1312 to be tested. (Dies 1312 can be dies of an unsingulated semiconductor wafer (e.g., like wafer 112 of FIG. 1A), singulated dies (e.g., held in a carrier (not shown)), dies forming a multi-chip module, or any other arrangement of dies to be tested.) (In FIGS. 13A, 13B, the mounting/wiring structure 1302, the semiconductor dies 1312, and the stage 1306 are shown in partial view. As described above, the probe card assembly 1300 can be mounted in a prober (not shown), and the stage 1306 can be in the prober.) In this example, the temperature of the dies 1312 is raised, which causes the dies 1312 and the probe card assembly 1322 to expand in response to the rising temperature. The dies 1312, however, expands at a greater rate than the probe head assembly 1322, and eventually, as shown in FIG. 13B, the probes 1324a-d no longer align with the terminals 1344 of the dies 1312. In the example of FIG. 13B, probe 1324d becomes so misaligned with its corresponding terminal 1344 that contact between probe 1324d and the terminal 1344 is lost. (The net expansion of the dies 1312 with respect to the probe head assembly 1322 is represented in FIG. 13B by arrows 1330.)

The temperature control device 1340 of the probe head assembly 1322 can be activated to correct the misalignment of the probes 1324a-d and the terminals 1344. That is, the temperature control device 1340 can be activated to heat the probe head assembly 1322 so that it expands as much as or approximately as much as the dies 1312. In FIG. 13C, the additional expansion of the probe head assembly 1322 caused by the temperature control device 1340 is represented by arrows 1332. As shown in FIG. 13C, this expansion causes the probes 1324a-d to realign with terminals 1344.

Of course, the temperature control device 1340 could alternatively cool the probe head assembly 1322 if cooling were needed to keep the probes 1324a-d aligned with the die terminals 1344 of the dies 1312 over a given test temperature range. Indeed, by thus controlling the temperature of the probe head assembly 1322 independently of the temperature of the dies 1312, the dies 1312 can be tested over a greater temperature range while keeping the probes 1324a-d and the die terminals 1344 aligned than would otherwise be possible. Temperature control device 1340 can thus be used to control positions (e.g., lateral positions) of probes 1324a-1324d, such as during testing of dies 1312.

In one embodiment, the portion of the probe head assembly 1322 to which the probes 1324a-d are mounted comprises a ceramic material and the dies 1312 comprises silicon. The probes 1324a-d can be positioned on the probe head assembly 1322 to align with the terminals 1344 on the dies 1312 while both the probe head assembly 1322 and the dies 1312 are at the highest temperature in the range of temperatures over which the dies (not shown) of the dies 1312 are to be tested. Thus, during testing of the dies of dies 1312, at the highest test temperature, the probes 1324a-d will naturally align with the die terminals 1344 without the need to alter the temperature of the probe head assembly 1322, and at all lower temperatures, the probe head assembly 1322 can be heated by temperature control device 1340 (which may thus be a heating device) to bring the probes 1324a-d into alignment with the die terminals 1344.

Figure 14:
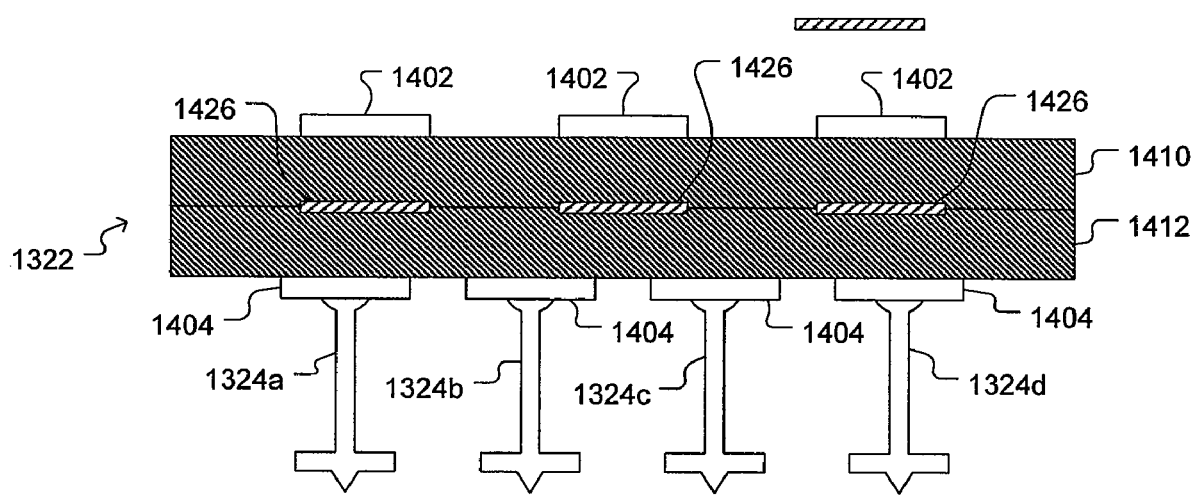
FIG. 14 illustrates an exemplary probe head assembly that may be used with the probe card assembly of FIGS. 13A, 13B, and 13C according to some embodiments of the invention.

In some embodiments, probe head assembly 1322 can comprise a multilayer substrate comprising one or more layers of conductive material disposed between one or more layers of insulating material. FIG. 14 illustrates an example of such a multilayer substrate according to some embodiments of the invention. As shown, probe head assembly 1322 can comprise a plurality of layers 1410, 1412 of an electrically insulating material (e.g., ceramic). (Although two layers 1410, 1412 are shown, more or fewer layers can be used.) Electrically conductive pads or traces 1402, 1404, 1426 can be disposed on and between insulating layers 1410, 1412, and electrically conductive vias (not shown) can be provided through one or both of layers 1410, 1412 to electrically connect pads or traces on different layers. As shown in FIG. 14, probes 1324a-d can be attached to pads 1404, and pads 1402 can provide electrical connections to mounting/wiring structure 1302 (see FIG. 13C). Vias (not shown) through layer 1410, traces (e.g., 1426 between layers 1410, 1412, and vias (not shown) through layer 1412) can electrically connect ones of pads 1402 with ones of pads 1404.

Temperature control device 1340 can comprise one or more of the conductive traces 1426 embedded between layers 1410, 1412. That is, one or more of traces 1426 can comprise a material that generates heat in response to current passing through the material. Current can be supplied to the one or more of traces 1426 forming such heaters through one or more of pads 1402 that are otherwise unused (e.g., not electrically connected to a pad 1404 with a probe 1324a-d). Current may be provided to the temperature control devices 1426 through electrical connections other than pads 1402. Regardless of how current is supplied to the temperature control devices 1426, a current can be applied in an amount needed to heat the probe head assembly 1322 sufficiently to keep the probes 1324a-d aligned with the terminals 1344 of the dies 1312 being tested as the temperature of the dies 1312 is changed during the testing, as described above (see FIGS. 13A-13C).

Electrically conductive material that generates heat while a current is passed through the material is but one example of temperature control device 1340. In other examples, temperature control device 1340 can comprise tubes through which heated or cooled liquid or gas is passed. Moreover, temperature control device 1340 can be disposed on the outside of probe head assembly 1322.

Figure 15:
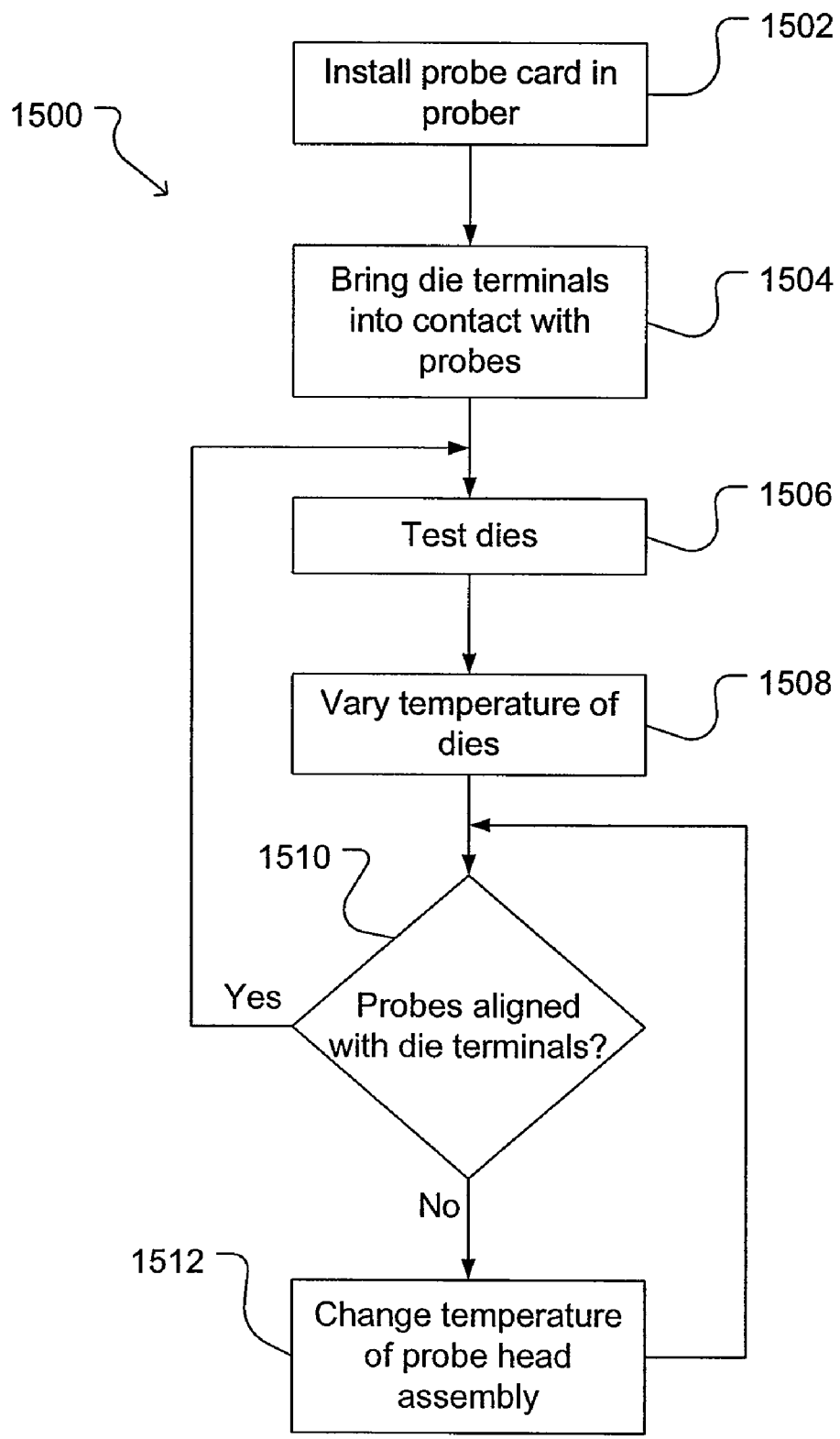
FIG. 15 illustrates an exemplary process that may be used to monitor and correct alignment of probes and die terminals during testing of the dies over a range of temperatures according to some embodiments of the invention.
Figure 16:
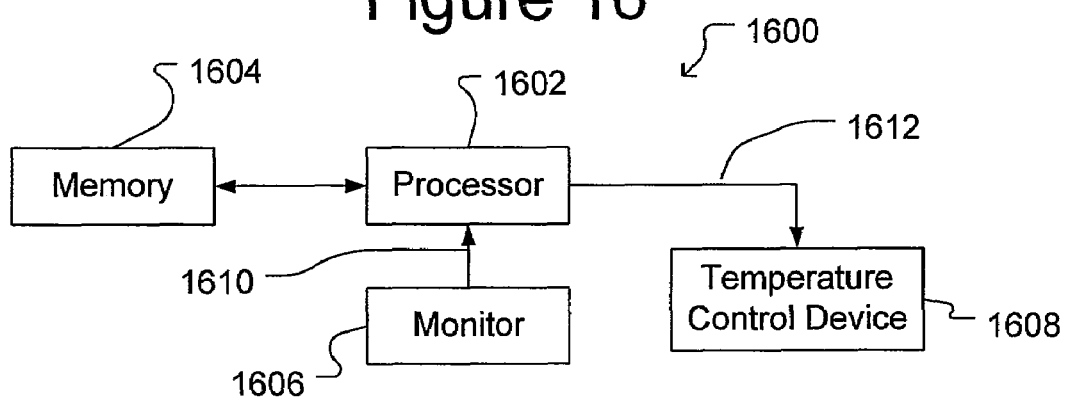
FIG. 16 illustrates an exemplary system on which the process of FIG. 15 may be implemented according to some embodiments of the invention.
Figure 17:
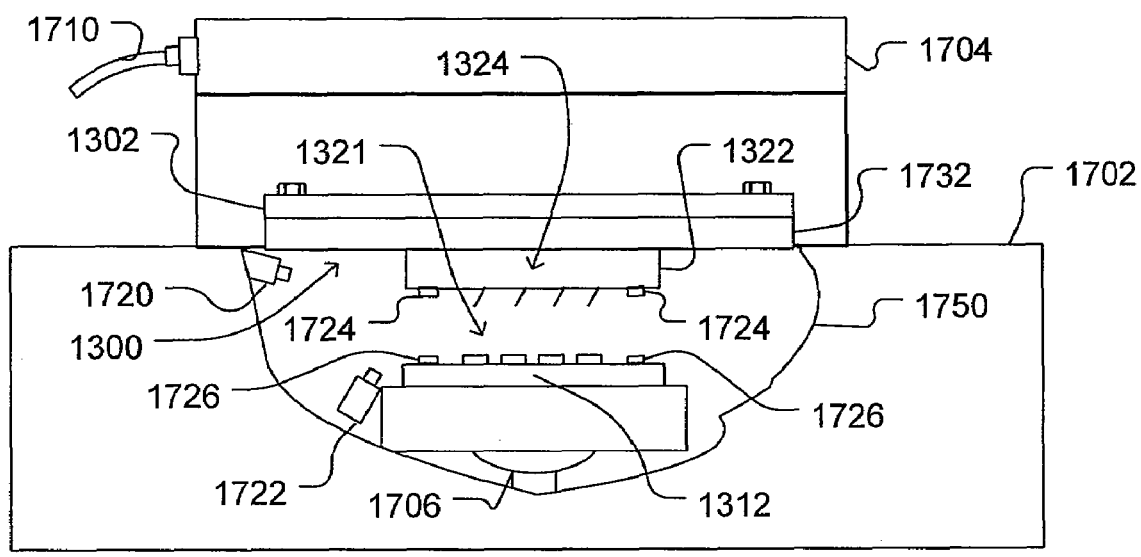
FIG. 17 illustrates an exemplary prober, probe card assembly, and wafer that illustrates an example of the monitor of FIG. 16 according to some embodiments of the invention.

FIG. 15 illustrates a process 1500 for monitoring alignment of the probes of a probe card assembly and the terminals of dies during testing of the dies as the temperature of the dies is varied and adjusting the temperature of the probe head assembly as needed to compensate for any detected misalignment. FIG. 16 illustrates a simplified block diagram of a system 1600 for implementing the process of FIG. 15, and FIG. 17 illustrates an exemplary test head 1704 and prober 1704 on which the process of FIG. 15 may be used.

As shown in FIG. 15, process 1500 can begin with installation of a probe card assembly in a prober (1502). Referring to the example shown in FIG. 17, probe card assembly 1300 (which, as described above can include a mounting/wiring structure 1302 and a probe head assembly 1322) can be bolted to the prober head plate 1732 of prober 1702. Referring again to FIG. 15, the probes of the probe card assembly can then be brought into contact with the terminals of dies to be tested (1504). For example, as shown in FIG. 17, a dies 1312 can be placed on a stage 1706 in the prober 1702, and the stage 1706 can move terminals 1321 of the dies (not shown) of the dies 1312 into contact with the probes 1324 of the probe card assembly 1300. At 1506 of FIG. 15, the dies can be tested. In the example shown in FIG. 17, a tester (not shown) generates test data that can be communicated via cable 1710 to test head 1704 and through probe card assembly 1300 to the dies (not shown) of dies 1312, and response data generated by the dies (not shown) can be communicated through the probe card assembly 1300, test head 1704, and cable 1710 back to the tester (not shown). (Connections like 114 in FIG. 1A, although not shown, can be present, connecting the test head 1704 to the probe card assembly 1300.) At 508 of FIG. 15, as the dies are being tested at 1506, the temperature of the dies can be varied. For example, the stage 1706 in FIG. 17 may include a heater and/or cooler for heating and/or cooling the dies 1312. While testing the dies at 1506 and varying the temperature of the dies at 1508, the process of FIG. 15 determines whether the probes and the die terminals are still properly aligned at 1510. If yes, the process 1500 of FIG. 15 continues to test the dies at 1506, vary the temperature of the dies at 1508, and monitor alignment of the probes and die terminals at 1510. If, however, it is determined at 1510 that the probes and the die terminals are no longer in proper alignment, the process 1500 changes the temperature of the probe head assembly at 1512 and then rechecks the alignment at 1510 until the probes and terminals are again in alignment as shown in FIG. 15. (Although not shown, provisions can be provided for terminating the process 1500 of FIG. 15 after 1506 once testing of the dies is completed, after repeating 1512 and 1510 a number of times without successfully bringing the probes and terminals into alignment, or for other reasons.)

FIG. 16 illustrates an exemplary system for implementing 1510 and 1512 of FIG. 15. As shown in FIG. 16, system 1600 can include a processor 1604 that operates in accordance with software (including without limitation microcode or firmware) stored in memory 1604. The processor 1604 can receive input 1610 from a monitor 1606, determine whether the input 1610 from the monitor 1606 indicates that the probes and die terminals are out of alignment (1510 of FIG. 15), and if so, can output controls signals 1612 to temperature control devices 1608 in the probe head assembly (1512 of FIG. 15). The temperature control devices 1608 may be any of the temperature control devices discussed above with respect to FIGS. 13A-13C and 14A-14D.

The monitor 1606 may be any device or system for determining directly or indirectly that the probes are out of alignment with the die terminals. FIG. 17 illustrates one such exemplary monitor 1606. In FIG. 17, alignment marks 1724 can be placed on the probe head assembly 1322. Corresponding alignment marks 1726 can be placed on the dies 1312. While marks 1724 on the probe head assembly 1322 are aligned with the corresponding marks 1726 on the dies 1312, the probes 1324 are properly aligned with the die terminals 1321. Cameras 1720 and 1722 in prober 1702 may be used to determine whether alignment marks 1724 on the probe head assembly 1322 are aligned with the corresponding alignment marks 1726 on the dies 1312. Monitor 1606 of FIG. 17 may thus comprise the cameras 1720 and 1722, and input 1610 to processor 1604 may comprise image data produced by the cameras 1720 and 1722.

Of course, the cameras 1720 and 1722 are but one example of a monitor 1606 that may be used with the system 1600 of FIG. 16. As another example, alignment marks 1724 and 1726 may be replaced with probes on one of the probe head assembly 1322 or the dies 1312 and target pads on the other of the probe head assembly 1322 or the dies 1312 in which the target pads output signals corresponding to the position of the probes on the target pads, such signals indicating relative movement of the probe head assembly 1322 with respect to the dies 1312.

As an alternative to the feedback controlled process 1500 shown in FIG. 15, the system of FIG. 17 could be operated without feedback control. That is, the system of FIG. 17 could be operated without monitoring alignment of the probes 1324 with the die terminals 1726 at 1510. Instead, the temperature of the probe head assembly 1322 could be changed at 1512 in accordance with changes to the temperature of the dies of dies 1312 at 1508. Such a simplified version of the process 1500 of FIG. 15 may be particularly useful where the relationship between the positions of probes 1324 and the temperature of the dies 1312 is known and predictable.

Figure 18:
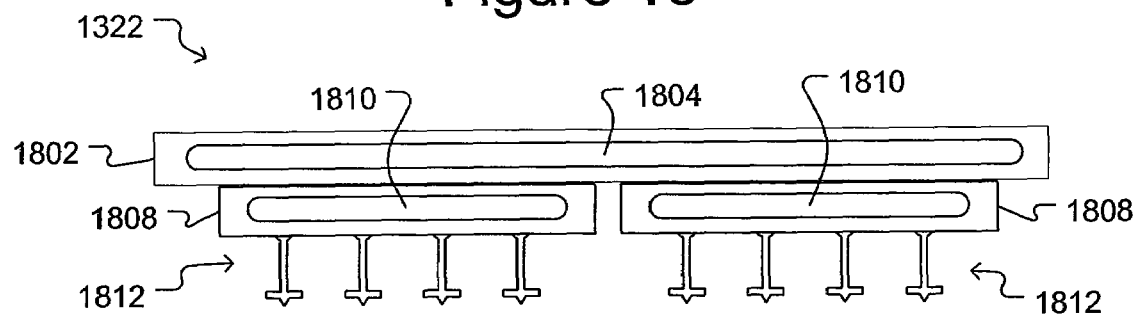
FIG. 18 illustrates an exemplary probe head assembly according to some embodiments of the invention.

FIG. 18 shows an exemplary probe head assembly 1322, which is another example of an implementation of probe head assembly 1322 shown in FIGS. 13A, 13B, and 13C. As shown in FIG. 18, the probe head assembly 1322 comprises a plurality of probe substrates 1808 (two are shown, although more than two may be included). A plurality of probes 1812 (which can be the same as probes 224) can be attached to each probe substrate 1808 and arranged to contact the terminals of dies (not shown) to be tested. Each probe substrate 1808 can be attached to an attachment structure 1802, which among other things, attaches to a mounting/wiring structure 1302 as shown in FIG. 13A and discussed above. The probe substrates 1808 may be attached to the attachment structure 1802 in any suitable manner, including without limitation using bolts, screws, clamps, adhesives, etc.

As shown in FIG. 18, each probe substrate 1808 can include a temperature control device 1810 to expand and contract the probe substrate 1808 as generally discussed above with respect to FIGS. 13A, 13B, and 13C. As also shown in FIG. 18, the attachment structure 1802 also can include a temperature control device 1804 to expand and contract the attachment structure 1802 in the same general manner as discussed above with respect to FIGS. 13A, 13B, and 13C. Because the probe substrates 1808 are attached to the attachment structure 1802, expanding or contracting the attachment structure 1802 affects the positions of the probe substrates 1808. The temperature control devices 1804 and 1810, which may be generally similar to temperature control device 1340 in FIG. 13A, thus provide two levels of control for positioning the probes 1812 with respect to die terminals (not shown) on dies (not shown) being tested: the temperature control device 1804 in attachment structure 1802 affects the positions of probe substrates 1808, and the temperature control device 1810 in each probe substrate 1808 affects the positions of the probes 1812 attached to the probe substrate 1808.

As an alternative to the temperature control device 1340 shown in FIGS. 13A, 13B, and 13C (or the temperature control devices 1426 shown in FIGS. 14C and 14D), a mechanical force could be applied to the probe head assembly 1322 to stretch or compress the probe head assembly 1322 so that it expands or contracts to match expansion or contraction of the dies 1312 under test (as generally shown in FIGS. 13A, 13B, and 13C). For example, threaded studs (not shown) could be attached to peripheral edges of the probe head assembly 1322, and threaded actuators (not shown) used to apply tensile or compression forces to the probe head assembly 1322 to stretch or compress, respectively, the probe head assembly 1322. As an example, such tensile forces could be applied to the probe head assembly 1322 to stretch (expand) the probe head assembly 1322 as shown in the transition from FIG. 13B to FIG. 13C (as represented by arrow 1332 in FIG. 13C). As yet another alternative, both the temperature control device 1340 and a mechanical device for applying mechanical forces to the probe head assembly 1322 could be used to expand or contract the probe head assembly 1322. In like manner, mechanical devices (not shown) for applying mechanical forces to the attachment structure 1802 and the probe substrates 1808 of FIG. 18 could be used in place of or in conjunction with the temperature control devices 1804 and 1810 of FIG. 18.

Figure 19:
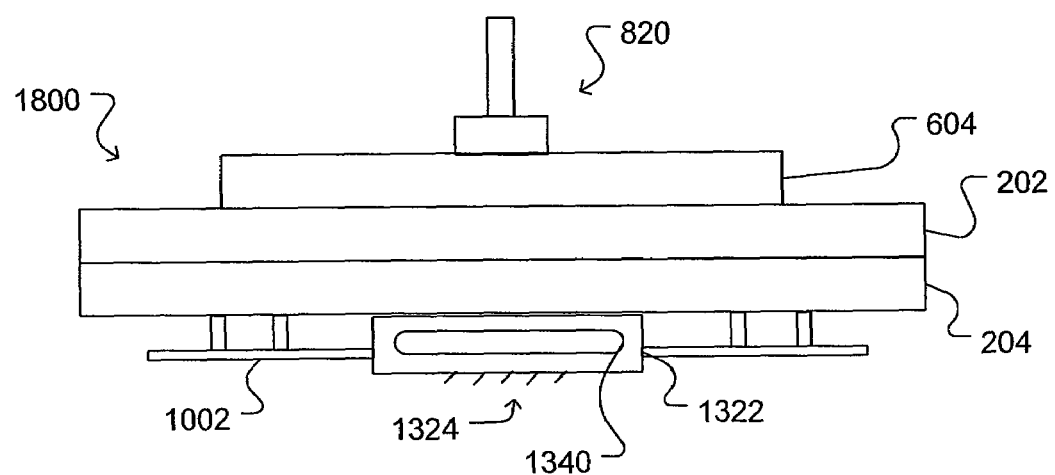
FIG. 19 illustrates an exemplary probe card assembly showing a combination of features from other probe card assemblies described herein according to some embodiments of the invention.

The various techniques described herein may be used together in various combinations. FIG. 19 illustrates an exemplary probe card assembly 1800 that can include a wiring board 204 and stiffener plate 202 as described above respect to FIGS. 2A, 2B, and 2C. The probe card assembly 1800 also can include a truss structure 604 as described above with respect to FIGS. 6, 7A, and 7B. A stud structure 820 like the stud structure described with respect to 9A and 9B can be attached to the truss structure 604. Probe card assembly 1800 also can include a heat sink 1002 as described above with respect to FIGS. 10A, 10B, and 10C. Probe card assembly 1800 can include a probe head assembly 1322 with temperature control device 1340 as described above with respect to FIGS. 13A, 13B, 13C, 14A, 14B, 14C, and 14D. The probe card assembly 1800 of FIG. 19 thus combines features from the probe card assemblies 200, 600, 900, 1000, and 1300.

Other combinations are possible. For example, the probe card assembly 1800 could include fans like fans 1102 or 1204 and air passages like air passages 1104 and 1106 in probe card assemblies 1100 and 1200 in place of or in addition to the heat sink 1002. As another example, the truss structure 604 could be removed from the probe card assembly 900, and the stud structure 820 could be attached to the stiffener plate 202. As yet another example, a truss structure 604 could be attached to the stiffener plate 202 (as shown in FIGS. 7A and 7B) of the probe assemblies 1000, 1100, or 1200. Still other combinations are possible.

Although exemplary embodiments and applications of the invention have been described herein, there is no intention that the invention be limited to these exemplary embodiments and applications or to the manner in which the exemplary embodiments and applications operate or are described herein. Indeed, many variations and modifications to the exemplary embodiments are possible. For example, although each of the embodiments is described herein in the context of testing semiconductor dies, the invention is not so limited but is applicable to any apparatus, system, or scenario in which a device is tested or monitored by probing the device.

As another example, some of the exemplary card assemblies illustrated and described herein are shown with one probe head assembly (e.g., 222 shown in FIG. 2C, among other figures), any of those probe card assemblies may be configured with more than one probe head assembly each comprising a set of probes, and the probe head assemblies can be disposed to form a large array of probes comprising the sets of probes on each of the probe head assemblies. Non-limiting examples of probe card assemblies with a plurality of probe head assemblies are shown in U.S. patent application Ser. No. 11/165,833, entitled "Method And Apparatus For Adjusting A Multi-Substrate Probe Structure," filed Jun. 24, 2005. Such probe card assemblies may be configured such that each probe head assembly is individually moveable independent of the other probe head assemblies.

What is claimed is:

1. A method of maintaining contact between probes and terminals of semiconductor devices, the method comprising:
coupling utilizing exclusively mechanically stiff components a probe head assembly comprising a plurality of probes for contacting terminals of semiconductor devices to a test system housing in which the semiconductor devices are disposed;
effecting contact between ones of the probes and ones of the terminals of the semiconductor devices;
monitoring an alignment in a plane that is generally parallel to a surface of the semiconductor devices on which the terminals are disposed of the ones of probes with respect to the ones of the terminals of the semiconductor devices; and
causing a substrate of the probe head assembly to which the probes are attached to expand or contract thermally in the plane so that the ones of the probes and the ones of the terminals of the semiconductor devices maintain sufficient alignment to maintain said contact as the semiconductor devices expand or contract thermally.

2. The method of claim 1, wherein the probe head assembly is part of a probe card assembly, the probe card assembly comprising an electrical interface to a tester for controlling testing of the semiconductor devices, the probe card assembly further comprising electrical connections from the interface to the probes.

3. The method of claim 2, wherein the monitoring comprises:
capturing images of the ones of the probes and the ones of the terminals of the semiconductor devices; and
determining positions of the ones of the probes and the ones of the terminals in the images.

4. The method of claim 2 further comprising after the effecting contact, testing the semiconductor devices by providing test signals from the tester through the probe card assembly and the ones of the probes to the semiconductor devices, wherein the monitoring and the causing are performed during the testing.

5. The method of 4 further comprising, during the testing, changing a temperature of the semiconductor devices.

6. The method of claim 2, wherein the causing comprises changing a temperature of the substrate to which the probes are attached.

7. The method of claim 6, wherein the changing a temperature comprises increasing a temperature of the substrate to cause the substrate to expand.

8. The method of claim 6, wherein the changing a temperature comprises reducing a temperature of the substrate to cause the substrate to contract.

9. The method of claim 6, wherein the changing a temperature comprises activating heating elements on or in the substrate.

10. The method of claim 6, wherein the changing a temperature comprises activating cooling elements on or in the substrate.

11. The method of claim 1, wherein the mechanically stiff components are metal components.

12. The method of claim 1, wherein the probe head assembly is coupled directly to a metal stiffener plate.

13. The method of claim 12, wherein the metal stiffener plate comprises a plurality of metal tabs that are coupled directly to the test system housing.

14. A system for testing semiconductor devices, the system comprising:
a prober configured to hold in contact a plurality of probes and a plurality of corresponding terminals of semiconductor devices disposed within the prober
a probe head assembly comprising a probe substrate to which the probes are coupled, the probe head assembly being coupled to the prober exclusively by mechanically stiff components;
a monitoring mechanism configured to monitor in a plane that is generally parallel to a surface of the semiconductor devices on which the terminals are disposed an alignment of the probes with respect to the corresponding terminals of the semiconductor devices; and
a temperature control device on or in the probe substrate; and
a controller configured to control the temperature control device and thereby expand or contract the probe substrate in the plane so that the probes and the corresponding terminals of the semiconductor device maintain sufficient alignment as monitored by the monitoring mechanism to keep the probes and the corresponding terminals in contact as the semiconductor devices expand or contract thermally.

15. The system of claim 14, wherein the probe head assembly is part of a probe card assembly, the probe card assembly comprising an electrical interface to a tester for controlling testing of the semiconductor devices, the probe card assembly further comprising electrical connections from the interface to the probes.

16. The system of claim 14, wherein the temperature control device comprises a heating element.

17. The system of claim 14, wherein the temperature control device comprises a cooling element.

18. The system of claim 14, wherein the monitoring mechanism comprises cameras positioned to capture images of the probes and the corresponding terminals of the semiconductor devices.

19. The system of claim 14, wherein the monitoring mechanism and the controller comprise a processor programmed to monitor the alignment of the probes with respect to the corresponding terminals of the semiconductor devices and control the temperature control device during testing of the semiconductor devices.

20. The system of claim 14, wherein:
additional probes are attached to a second probe substrate comprising a second temperature control device;
the monitoring mechanism is further configured to monitor an alignment of the additional probes with corresponding additional terminals of the semiconductor devices;
the probe head assembly comprising an attachment structure to which the probe substrate and the second probe substrate are attached, the attachment structure comprising a third temperature control device;
the controller further configured to control the second temperature control device and the third temperature control device and thereby expand or contract the second probe substrate and the attachment structure in accordance with the alignment of the probes and the corresponding terminals and the additional probes and the corresponding additional terminals as monitored by the monitoring mechanism.

21. The system of claim 14, wherein the mechanically stiff components are metal components.

22. The system of claim 14, wherein the probe head assembly is coupled directly to a metal stiffener plate.

23. The system of claim 22, wherein the metal stiffener plate comprises a plurality of metal tabs that are coupled directly to the test system housing.

* * * * *